US006893795B2

(12) United States Patent
Kawauchi et al.

(10) Patent No.: US 6,893,795 B2
(45) Date of Patent: May 17, 2005

(54) LITHOGRAPHIC PRINTING PLATE PRECURSOR AND PRODUCTION METHOD OF LITHOGRAPHIC PRINTING PLATE

(75) Inventors: Ikuo Kawauchi, Shizuoka (JP); Akio Oda, Shizuoka (JP); Hideo Miyake, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/190,545

(22) Filed: Jul. 9, 2002

(65) Prior Publication Data

US 2003/0129532 A1 Jul. 10, 2003

(30) Foreign Application Priority Data

Jul. 9, 2001 (JP) .................................... P.2001-208085
Jul. 12, 2001 (JP) .................................... P.2001-212309

(51) Int. Cl.[7] .......................... G03F 7/038; G03F 7/11; G03F 7/30; G03F 7/32

(52) U.S. Cl. ............................... 430/271.1; 430/273.1; 430/156; 430/160; 430/162; 430/165; 430/163; 430/912; 430/914; 430/944; 430/945; 430/908; 430/906; 430/302

(58) Field of Search .......................... 430/271.1, 273.1, 430/156, 160, 162, 165, 163, 906, 908, 912, 914, 944, 945

(56) References Cited

U.S. PATENT DOCUMENTS

2002/0136979 A1 * 9/2002 Miyake et al. ........... 430/273.1

FOREIGN PATENT DOCUMENTS

| | | | | | |
|---|---|---|---|---|---|
| EP | 230995 | A2 * | 8/1987 | | |
| EP | 950517 | A1 * | 10/1999 | ............. | B41C/1/10 |
| EP | 1072432 | A2 * | 1/2001 | ............ | B41M/5/36 |
| EP | 1211065 | A2 * | 6/2002 | ............. | B41C/1/10 |

* cited by examiner

*Primary Examiner*—Cynthia Hamilton
(74) *Attorney, Agent, or Firm*—Sughrue Mion, PLLC

(57) ABSTRACT

A positive working lithographic printing plate precursor comprising a lower layer containing a water-insoluble and alkali-soluble resin, and an upper heat-sensitive layer containing a water-insoluble and alkali-soluble resin and an infrared absorbing dye and increasing the solubility in an alkaline aqueous solution by heating, provided in this order on a hydrophilic support, and (a) the upper heat-sensitive layer containing at least two kinds of surface active agents, or (b) the lower layer and upper heat-sensitive layer each containing a surface active agent different from each other.

6 Claims, No Drawings

LITHOGRAPHIC PRINTING PLATE PRECURSOR AND PRODUCTION METHOD OF LITHOGRAPHIC PRINTING PLATE

FIELD OF THE INVENTION

The present invention relates to a lithographic printing plate precursor, which can be used as an offset printing master, and to a production method of a lithographic printing plate. More specifically, the invention relates to a positive working lithographic printing plate precursor for use in so-called direct plate-making capable of producing a printing plate directly from digital signals of a computer or the like with an infrared laser, and a method for producing a lithographic printing plate from the printing plate precursor.

BACKGROUND OF THE INVENTION

The progress of lasers in recent years has been remarkable and a high output and compact solid laser or semiconductor laser having a light emission region in the range of from near infrared to infrared has become easily available. These lasers are very useful as a light exposure source in the case of directly making a printing plate from digital data of a computer or the like.

The positive working printing plate material for an infrared laser contains an alkali aqueous solution-soluble binder resin, an IR dye generating heat by absorbing light, etc., as the indispensable components, in the unexposed areas (image areas), the IR dye, etc., functions as a dissolution inhibitor of substantially lowering the solubility of the binder resin by the interaction with the binder resin, and in the exposed areas (non-image areas), the interaction of the IR dye, etc., and the binder resin is weakened by the action of the generated heat, whereby the exposed areas are dissolved in an alkali developer to form a lithographic printing plate.

However, in such a lithographic printing plate precursor for infrared laser, there is a problem that the difference between the dissolution resistance of the non-exposed areas (image areas) to the developer and the solubility of the exposed areas (non-image areas) in various using conditions is yet insufficient, and an excessive development or an inferior development is liable to occur by the fluctuation of the using conditions. Also, since the image-forming faculty of a lithographic printing plate precursor depends upon the heat generation at the surface of a recording layer by an infrared laser exposure, there is also a problem that in the vicinity of a support, the quantity of heat used for the image formation, that is, used for dissolving the recording layer is reduced by the diffusion of heat to reduce the difference between the exposed area and the unexposed area, whereby the reproducibility of highlight is insufficient.

For example, about the development latitude, in a positive working lithographic printing plate precursor material of making a printing plate by a UV exposure, that is, a conventional positive working lithographic printing plate precursor material containing an alkali aqueous solution-soluble binder resin and an onium salt or quinonediazide and having a function that the onium salt or quinonediazide functions as a dissolution inhibitor by the interaction with the binder resin in the non-exposed areas (image areas), and is decomposed by the action of light to generate an acid and functions as a dissolution accelerator in the exposed areas (non-image areas), there scarcely occur problems. However, since in the positive working lithographic printing plate precursor material, the UV exposure is imagewise carried out via a lith film and the diffraction of light is liable to occur, there is a problem in the highlight reproducibility.

On the other hand, in a positive working lithographic printing plate precursor material for an infrared laser, an infrared absorbent, etc., only functions as a dissolution inhibitor of the non-exposed areas (image areas) and does not accelerate to the dissolution of the exposed areas (non-image areas). Accordingly, for obtaining the difference in solubility between the non-exposed areas and the exposed areas in the positive working lithographic printing plate precursor material for infrared laser, the binder resin previously having a high solubility in an alkali developer cannot but use, whereby there are problems that the lithographic printing plate precursor material becomes inferior in the scratch resistance and unstable in the state before development.

Furthermore, in a double-layer type photosensitive layers (heat-sensitive layers) as the present invention, even when ununiformities of the surface state slightly generate on the lower layer and upper layer in a level of causing no problem, they are amplified by the existence of many layers, and although it is difficult to find them as surface fault, after development, they are actualized as the ununiformity of the image reproducibility or the unevenness of dot image area. Therefore, with regard to the plane ununiformities of the lower layer and upper layer, the higher level than usual is required.

SUMMARY OF THE INVENTION

Accordingly, an object of the present invention is to overcome the above-described problems, that is to provide a positive working lithographic printing plate precursor for direct plate-making using an infrared laser, which is excellent in the development latitude at the image formation, restrains the generation of defects caused by the scratches of image areas, and can realize the uniform image reproducibility over the whole area, and to provide a method for producing a lithographic printing plate.

As the result of making extensive investigations for attaining the above-described object, the present inventors have found that by constructing a heat-sensitive layer with two-layer structure (double-layer type photosensitive layer) of a lower heat-sensitive layer and an upper heat-sensitive layer, and using two kinds of different surface active agents, excellent development latitude and scratch resistance and uniform image reproducibility can be realized, and have accomplished the present invention.

That is, the present invention includes the following items.

(1) A positive working lithographic printing plate precursor comprising a lower layer containing a water-insoluble and alkali-soluble resin, and an upper heat-sensitive layer containing a water-insoluble and alkali-soluble resin and an infrared absorbing dye and increasing the solubility in an alkaline aqueous solution by heating, provided in this order on a hydrophilic support, and the upper heat-sensitive layer containing at least two kinds of surface active agents.

(2) A positive working lithographic printing plate precursor comprising a lower layer containing a water-insoluble and alkali-soluble resin, and an upper heat-sensitive layer containing a water-insoluble and alkali-soluble resin and an infrared absorbing dye and increasing the solubility in an alkaline aqueous solution by heating, provided in this order on a hydrophilic support, and the lower layer and upper heat-sensitive layer each containing a surface active agent different from each other.

(3) The positive working lithographic printing plate precursor described in item (2), wherein a concentration of the surface active agent contained in the upper heat-sensitive layer is higher than a concentration of the surface active agent contained in the lower layer.

(4) The positive working lithographic printing plate precursor described in any one of items (1) to (3), wherein at least one of the surface active agents is a fluorine-containing surface active agent.

(5) The positive working lithographic printing plate precursor described in any one of items (1) to (4), wherein the water-insoluble and alkali-soluble resin contained in the upper heat-sensitive layer is a resin having a phenolic hydroxyl group.

(6) A method for producing a lithographic printing plate comprising:

imagewise exposing a lithographic printing plate precursor comprising a lower layer containing a water-insoluble and alkali-soluble resin, and an upper heat-sensitive layer containing a water-insoluble and alkali-soluble resin and an infrared absorbing dye and increasing the solubility in an alkaline aqueous solution by heating, provided in this order on a hydrophilic support, and the upper heat-sensitive layer containing at least two kinds of surface active agents; and developing the exposed lithographic printing plate precursor with an alkali developer.

(7) A method for producing a lithographic printing plate comprising:

imagewise exposing a lithographic printing plate precursor comprising a lower layer containing a water-insoluble and alkali-soluble resin, and an upper heat-sensitive layer containing a water-insoluble and alkali-soluble resin and an infrared absorbing dye and increasing the solubility in an alkaline aqueous solution by heating, provided in this order on a hydrophilic support, and the lower layer and upper heat-sensitive layer each containing a surface active agent different from each other; and developing the exposed lithographic printing plate precursor with an alkali developer.

(8) The method for producing a lithographic printing plate described in item (7), wherein a concentration of the surface active agent contained in the upper heat-sensitive layer is higher than a concentration of the surface active agent contained in the lower layer.

DETAILED DESCRIPTION OF THE INVENTION

In the positive working lithographic printing plate precursor, of the above-described two kinds of different surface active agents, one has an effect for the image formation, that is, the development latitude and the scratch resistance, and the other has an effect for the surface state improvement.

The reason for exhibiting the effect to the development latitude and the scratch resistance is that the surface active agents are maldistributed at the surface of the heat-sensitive layer and the resistance to an alkali developer is strengthened in only the vicinity of the surface of the non-exposed areas. In the vicinity of the surface of the exposed area, since the surface maldistribution of the surface active agents are homogenized by light exposure, the resistance to an alkali developer as described above is not obtained, and a fault, for example, lowering of the sensitivity is not caused.

With regard to the surface state, in the double layer-type heat-sensitive positive working lithographic printing plate precursor, the influences not only on the external appearance of surface state but also on the performance are remarkable. Accordingly, the use of only a surface active agent for improving the image forming property is insufficient and the addition of a different surface active agent having the effect of sufficiently improving the surface state is effective.

As described above, according to the invention, by using the heat-sensitive layer composed of a double layer structure, and the upper heat-sensitive layer containing at least two kinds of surface active agents, or each of the lower layer and the upper heat-sensitive layer containing a surface active agent different from each other, the positive working lithographic printing plate precursor for direct plate-making using an infrared laser having the heat-sensitive layer, which is excellent in the sensitivity and the development latitude at the image formation, restrains the generation of defects caused by scratches of the image areas, and can form good images can be obtained.

Now, the positive working lithographic printing plate precursor and the plate-making method using it according to the invention are described in detail below.

The heat-sensitive layer of the positive working lithographic printing plate precursor of the invention is characterized by having a laminated layer structure composed of an upper heat-sensitive layer provided at the position near the surface (light-exposure surface) and a lower layer provided on the side near the support and containing an alkali-soluble resin.

It is necessary that each of these layers contains a water-insoluble and alkali-soluble resin and the upper heat-sensitive layer disposed at the upper portion contains an infrared absorbing dye.

Each component constituting the positive working lithographic printing plate precursor of the invention is described below.

<Surface Active Agent>

In one embodiment of the lithographic printing plate precursor of the invention, the upper heat-sensitive layer is characterized by containing at least two kinds of surface active agents. One of the two kinds of the surface active agents is a surface active agent for improving the image-forming property and the other is a surface active agent for improving the coated surface state. In this case, the lower layer may or may not contain a surface active agent.

Also, another embodiment of the invention is characterized in that each of the lower layer and the upper heat-sensitive layer contains a surface active agent different from each other. One of these surface active agents is a surface active agent for improving the image-forming property and the other is a surface active agent for improving the coated surface state. Preferably, the upper heat-sensitive layer contains a surface active agent for improving the image-forming property and the lower layer contains a surface active agent for improving the coated surface state.

As the surface active agent for improving the image-forming property, the nonionic surface active agents as described in JP-A-62-251740 and JP-A-3-208514 (the term "JP-A" as used herein means an "unexamined published Japanese patent application"), the amphoteric surface active agents as described in JP-A-59-121044 and JP-A-4-13149, the siloxane-base compounds as described in EP 950517, and the surface active agents of copolymers comprising fluorine-containing monomers as described in JP-A-11-288093 can be used.

Specific examples of the nonionic surface active agent include sorbitan tristearate, sorbitan monopalmitate, sorbitan trioleate, stearic acid monoglyceride and polyoxyethylene nonylphenyl ether. Specific examples of the amphoteric surface active agent include alkyl di(aminoethyl)glycine, alkyl polyaminoethylglycine hydrochloride, 2-alkyl-N-carboxyethyl-N-hydroxyethylimidazolinium betain and N-tetradecyl-N,N-betain type surface active agent (for example, "Amorgen K", trade name: manufactured by DAI-ICHI KOGYO SEIYAKU CO., LTD.).

As the siloxane-base compound, a block copolymer of dimethylsiloxane and polyalkylene oxide is preferred, and specific examples thereof include polyalkylene oxide-modified silicones, for example, DBE-224, DBE-621, DBE-712, DBP-732 and DBP-534 (trade names, manufactured by CHISSO CORPORATION), and Tego Glide 100 (trade name, manufactured by Tego A.G.).

Preferred specific examples of the copolymer of fluorine-containing monomer include the fluorine-containing acrylic polymers of P-1 to P-13 described in JP-A-11-288093, the fluorine-containing polymers obtained by copolymerizing acrylic monomers containing fluorine of A-1 to A-33 and appropriate acrylic monomers described in JP-A-2000-187318.

Regarding molecular weight of the above-described fluorine-containing polymer, the fluorine-containing polymer having a weight average molecular weight of at least 2,000 and a number average molecular weight of at least 1,000 is preferably used, and the fluorine-containing polymer having a weight average molecular weight of from 5,000 to 30,000 and a number average molecular weight of from 2,000 to 25,000 is more preferably used. Also, as a commercially available product, Megafac MCF 312, trade name, manufactured by DAINIPPON INK & CHEMICALS, INC., can be used.

Further, a fluorine-containing polymer containing a repeating unit derived from a (meth)acrylate monomer having two or three perfluoroalkyl groups each having from 3 to 20 carbon atoms is preferably used in the invention.

The fluorine-containing polymer contains a (meth) acrylate monomer unit having two or three perfluoroalkyl groups each having from 3 to 20 carbon atoms (hereinafter, the (meth)acrylate monomer is referred to as a "fluorine-containing monomer") as a polymerization component. The fluorine-containing monomer is not particularly restricted as long as it is a monomer wherein two or three perfluoroalkyl groups each having from 3 to 20 carbon atoms are bonded to an acryloyl group or a methacryloyl group with a tetravalent linkage group. In the case of using a monomer containing only one such perfluoroalkyl group or a monomer containing a perfluoroalkyl group having less than three carbon atoms, the discrimination improving effect may not be achieved, whereas when the number of carbon atoms in the perfluoroalkyl group exceeds 20, the sensitivity tends to decrease.

It is preferable that the fluorine-containing polymer contains the fluorine-containing monomer represented by formula (I) shown below as the polymerization component.

(I)

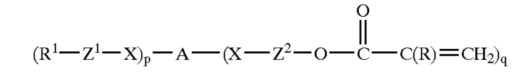

In formula (I), $R^1$ represents a perfluoroalkyl group having from 3 to 20 carbon atoms. $R^1$ may also represent a perfluoroalkenyl group having from 3 to 20 carbon atoms. The perfluoroalkyl or perfluoroalkenyl group may be straight chain, branched, cyclic, or a combination of thereof, and may further have an oxygen atom in the chain, for example, $(CF_3)_2CFOCF_2CF_2$—.

$Z^1$ represents $-(CH_2)_n-$ (wherein, n represents an integer of from 1 to 6) or a group shown below (wherein, $R^2$ represents a hydrogen group or an alkyl group having from 1 to 10 carbon atoms). Two or three of the linkage groups represented by $Z^1$ in formula (I) may be the same or different from each other.

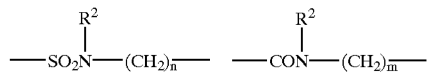

$Z^2$ represents $-(CH_2)_m-$ (wherein, m represents an integer of from 2 to 6) or a group shown below. Of the groups, $-(CH_2)_m-$ is particularly preferred.

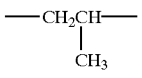

In formula (I), R represents a hydrogen atom, a methyl group or a halogen atom (e.g., Cl or Br). X represents a divalent linkage group shown below (wherein, Y represents a divalent linkage group having not more than 15 carbon atoms and a weight ratio in the divalent linkage group represented by X of from 35 to 65%).

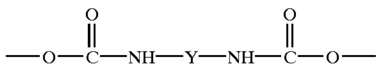

Typical examples of the divalent linkage group represented by Y include the following linkage groups.

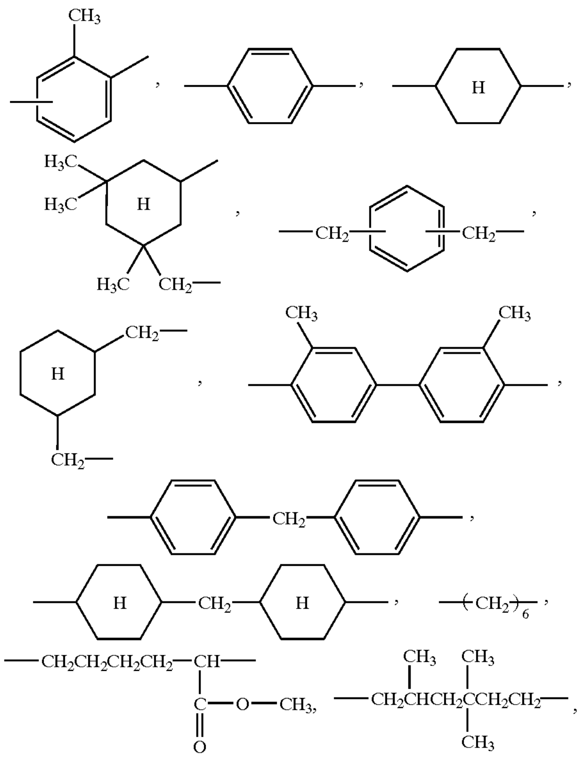

-continued
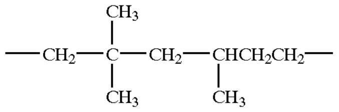,
In formula (I), p and q are each represent an integer satisfying p+q=4, wherein p is 2 or 3. A represents any one of the tetravalent linkage groups shown below.
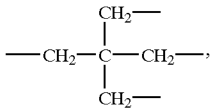,
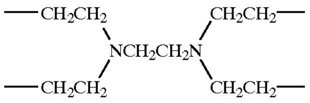
-continued
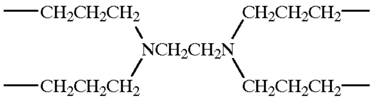
or
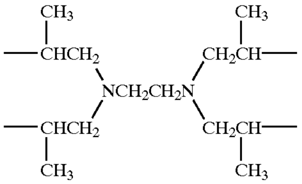
Specific examples of the fluorine-containing monomer are shown below, but the invention is not limited to these examples.
A-1
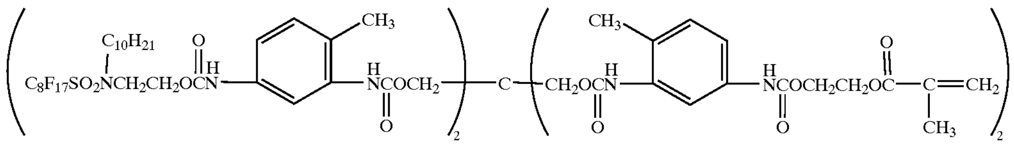
A-2
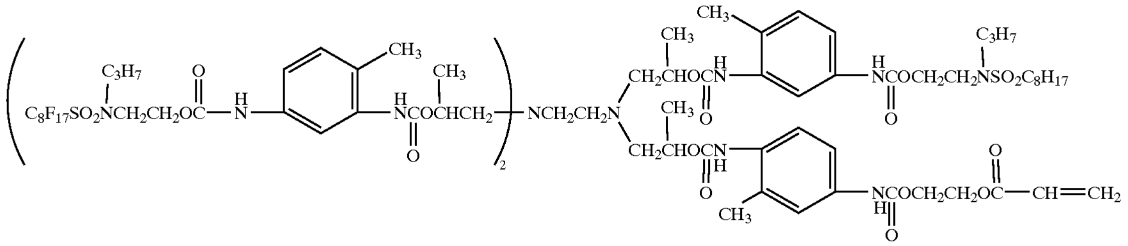
A-3
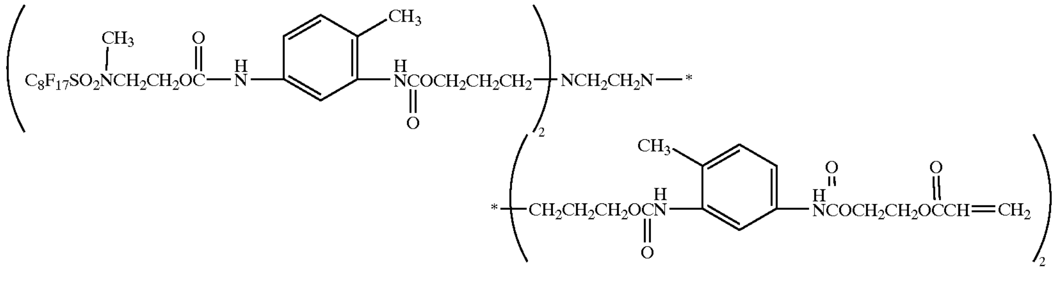
A-4
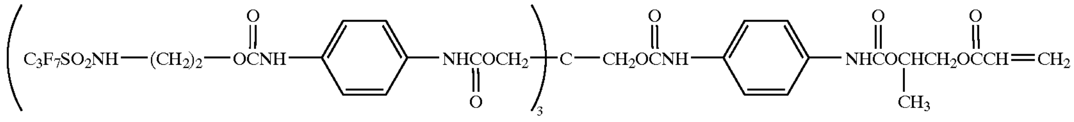
A-5
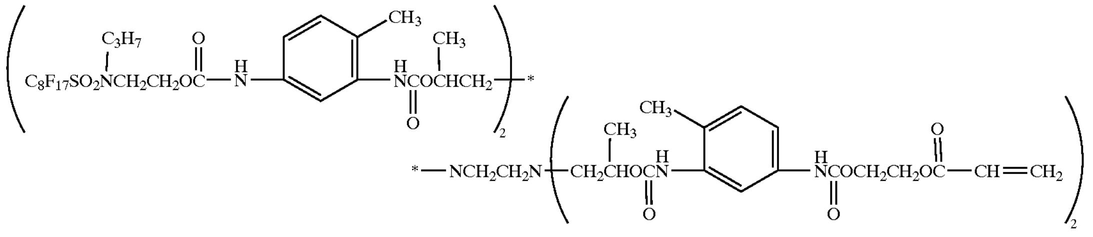

-continued
A-6
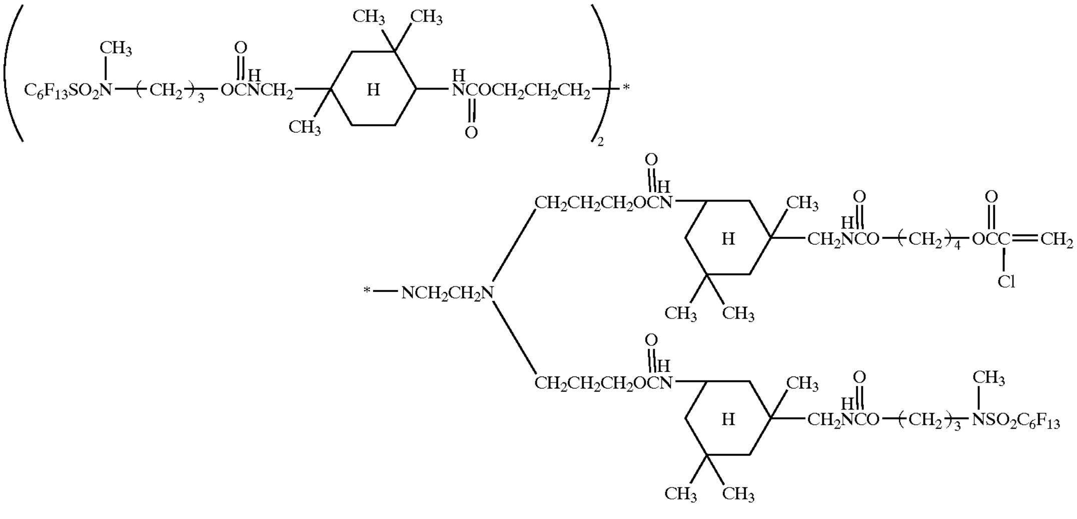
A-7
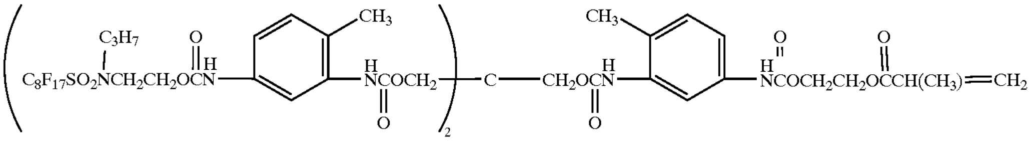
A-8
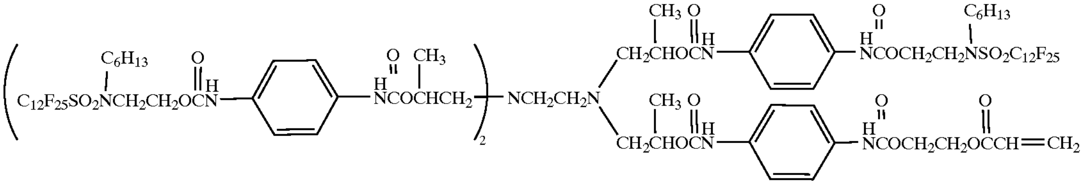
A-9
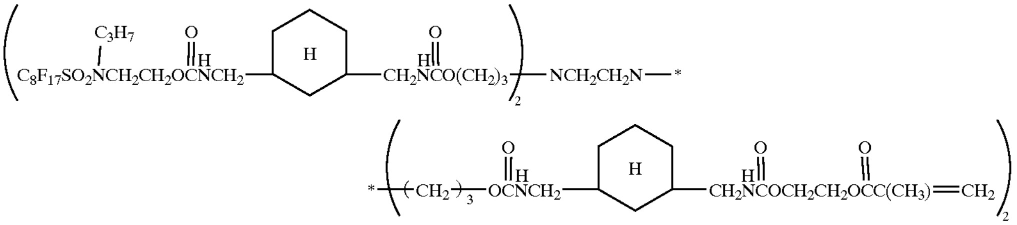
A-10
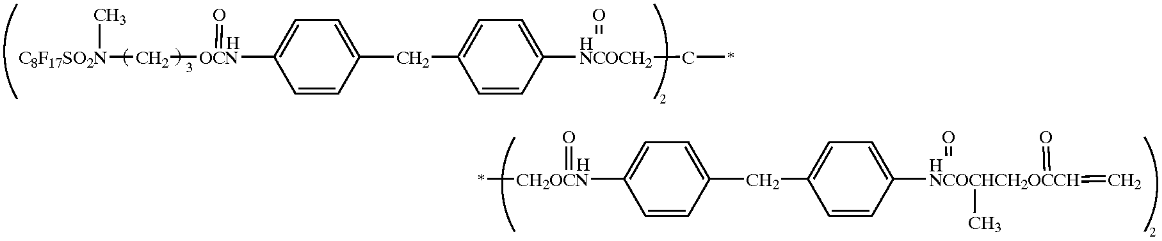
A-11
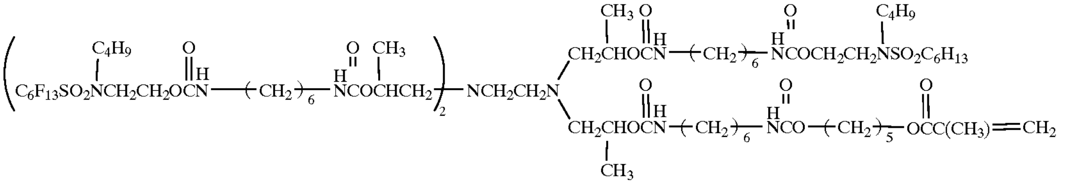

-continued
A-12
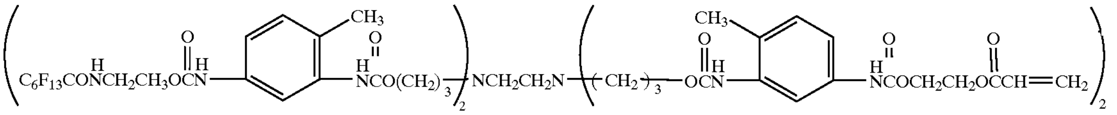
A-13
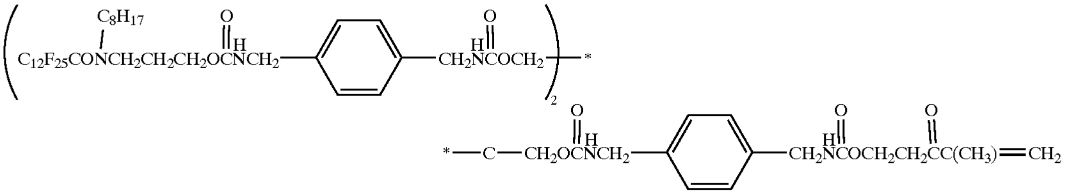
A-14
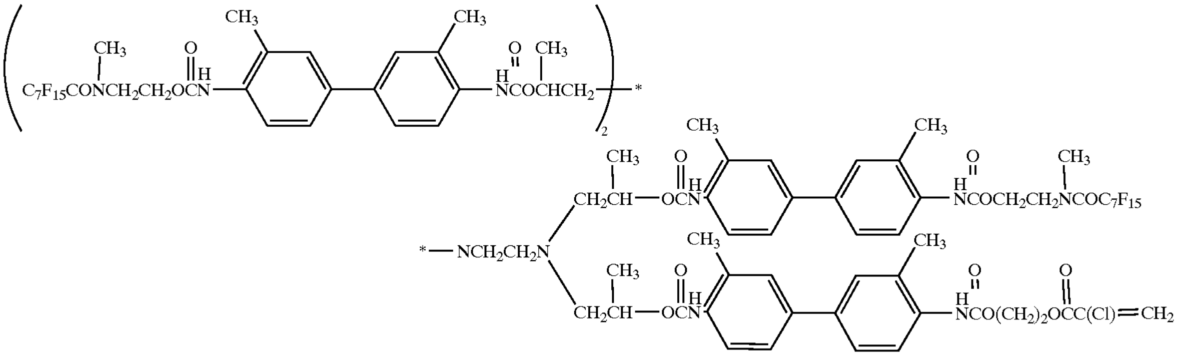
A-15
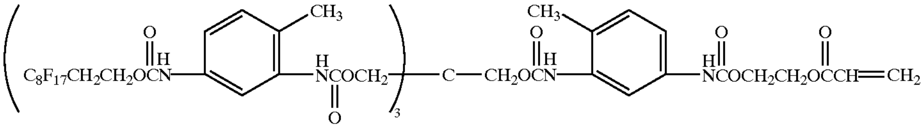
A-16
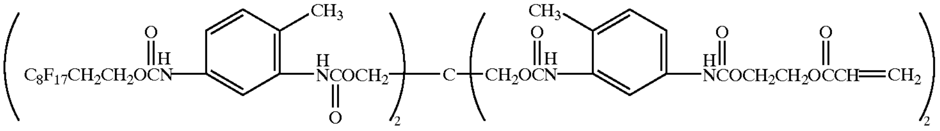
A-17
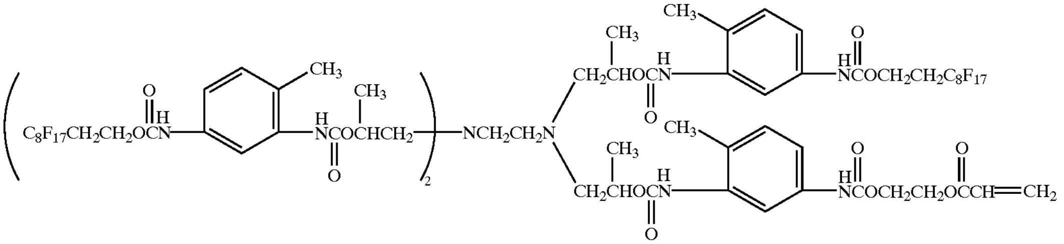
A-18
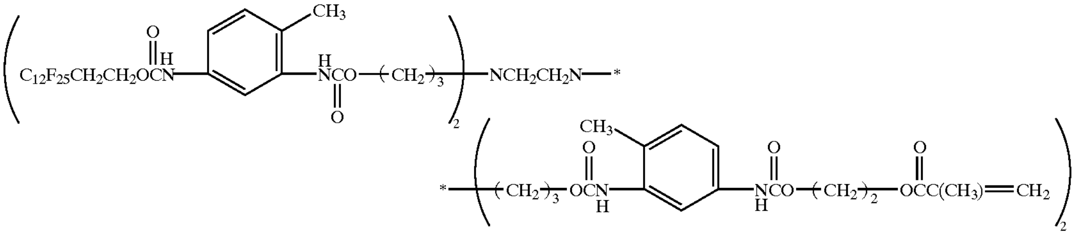
A-19
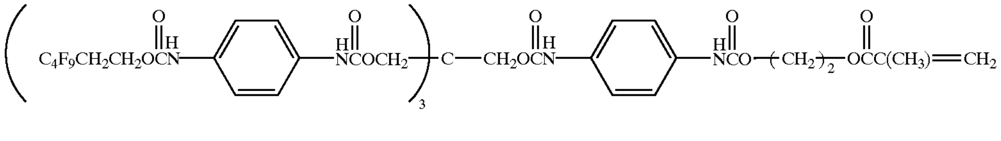

-continued
A-20
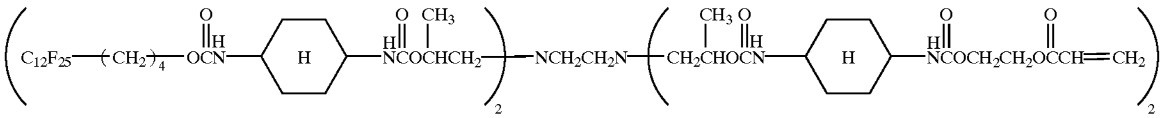
A-21
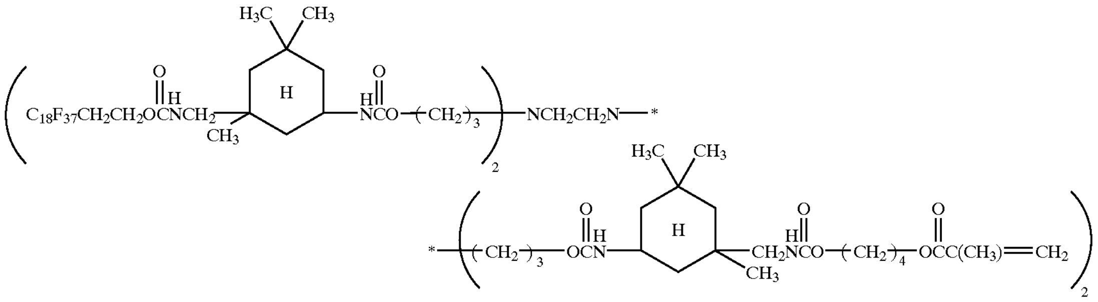
A-22
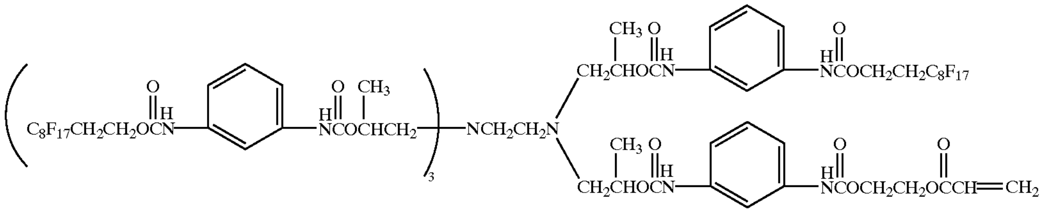
A-23
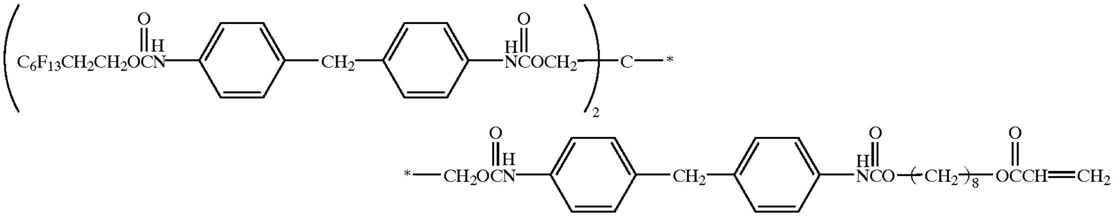
A-24
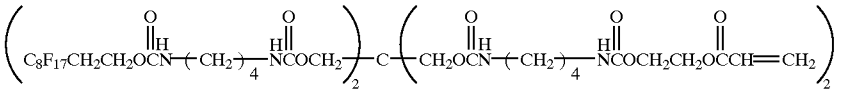
A-25
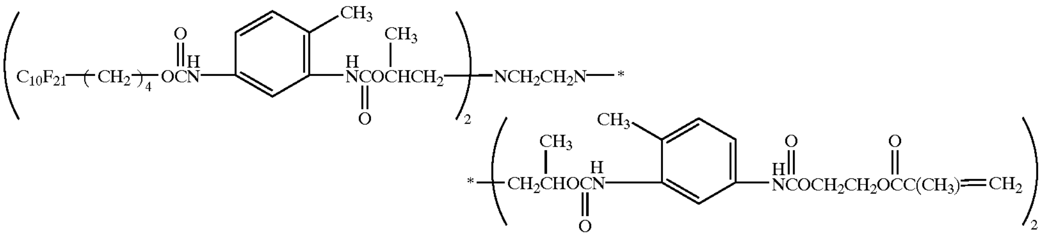
A-26
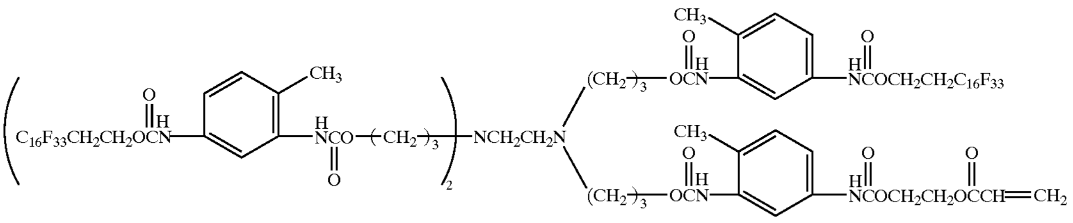

-continued
A-27
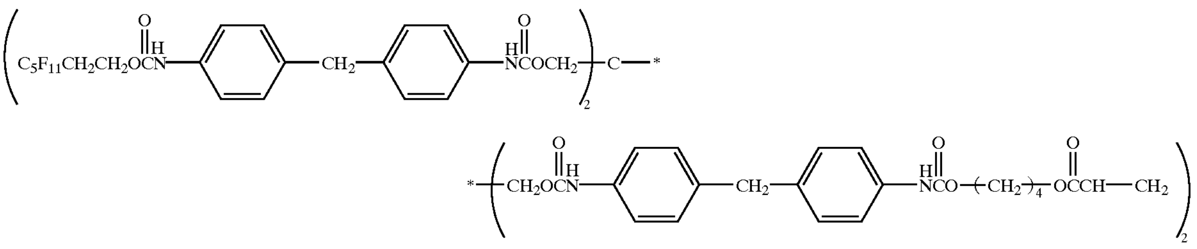
A-28
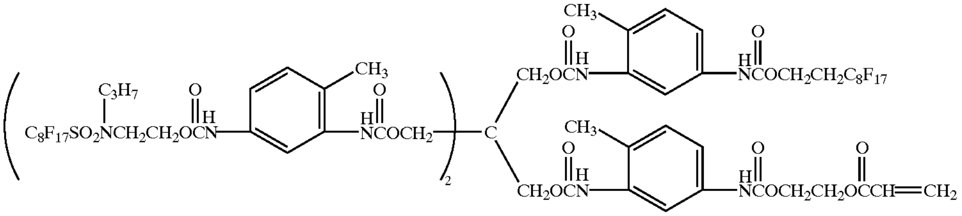
A-29
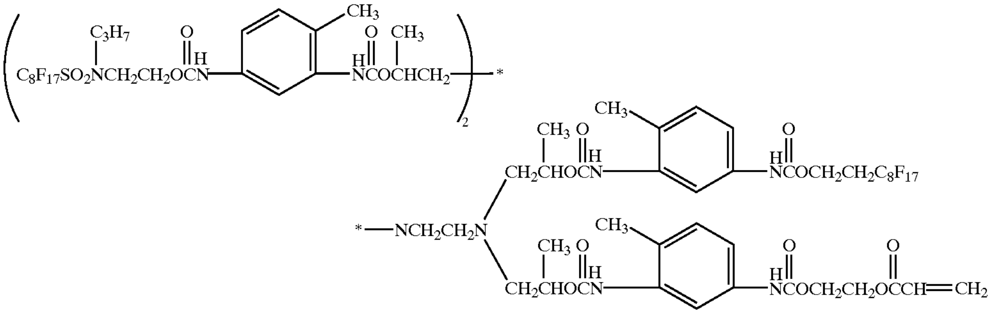
A-30
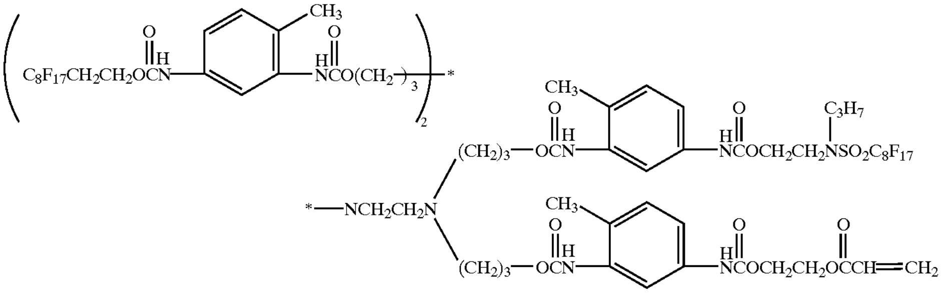
A-31
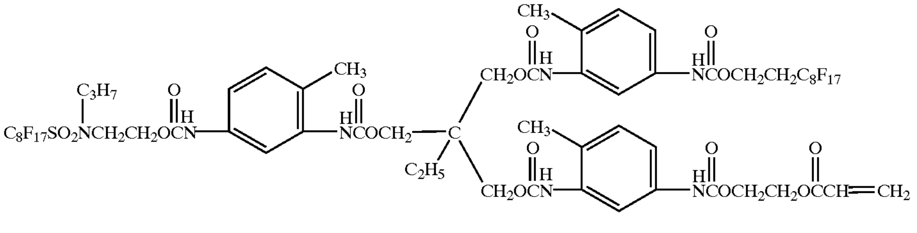
A-32
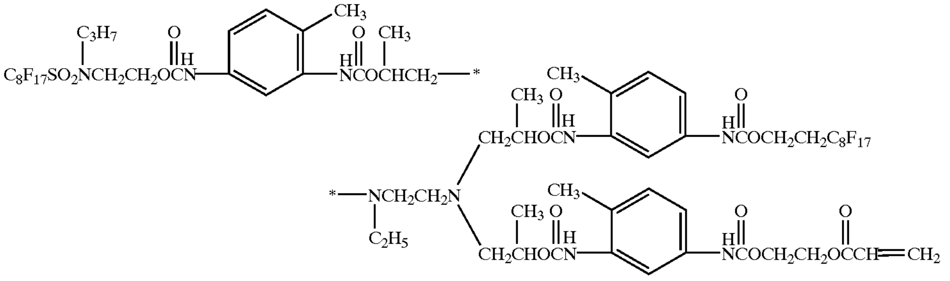

-continued

A-33

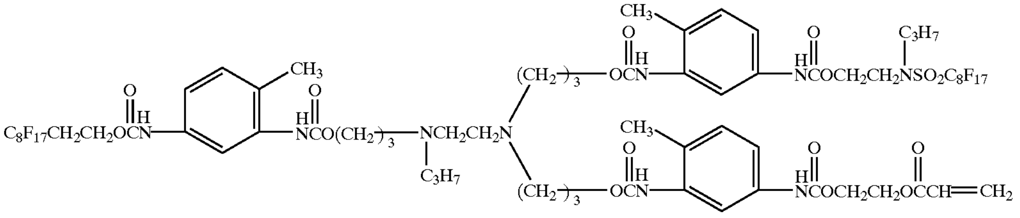

Of the above-described specific examples, Monomers A-15 to A-27 are particularly preferred.

The fluorine-containing polymer may be a copolymer of a (meth)acrylate monomer having two or three perfluoro-alkyl group having from 3 to 20 carbon atoms and a hydrocarbon (meth)acrylate monomer. A hydrocarbon (meth)acrylate monomer having an OH group is preferred. Also, the monomer may be used together with a hydrocarbon-base acrylate.

The hydrocarbon-base acrylate has one or two acryloyl groups and can be appropriately selected from those known in the field of art, for example, the compounds described in Table 10 of pages 34 and 35, Table 16 of pages 46 to 48, Table 20 of page 57, Table 60 of pages 170 to 172 in Kiyomi Kato and Shoji Nakahara, *Introduction to UV Curing Technology* (Kobunshi Kanko Kai). Specifically, they include the following monomers B-1 to B-8. of these monomers, B-2 is particularly preferred.

B-1

$CH_2{=}C(R^3)COOR^4$

B-2

$CH_2{=}C(R^3)COOCH_2CH_2OH$

B-3

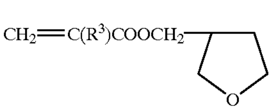

B-4

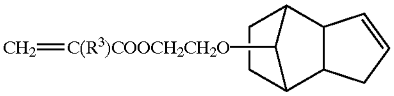

B-5

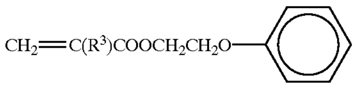

B-6

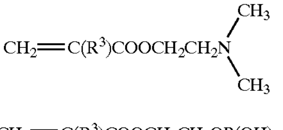

B-7

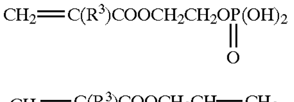

B-8

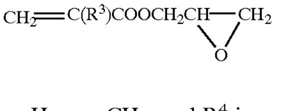

(Wherein, $R^3$ is —H or —$CH_3$, and $R^4$ is an alkyl group of 1 to 20 carbon atoms)

There is no particular restriction on a molecular weight of the fluorine-containing polymer. The polymer having a weight average molecular weight of from 3,000 to 200,000 is preferred and the polymer of from 4,000 to 100,000 is more preferred.

As the surface active agents for improving the image-forming property, the fluorine-containing surface active agents are preferably used.

As the surface active agents for improving the coated surface state, for example, the fluorine-containing surface active agents described in JP-A-62-170950 can be used. Commercially available fluorine-containing surface active agents can be used. Specific examples thereof include Megafac F-171, F-173, F-176, F-183 and F-184, trade names, manufactured by DAINIPPON INK & CHEMICALS, INC.

In the upper heat-sensitive layer, it is desirable to use the surface active agent for improving the image-forming property together with the surface active agent for improving the coated surface state. In such a case, the amount of the surface active agents added is preferably from 0.05 to 15% by weight, and more preferably from 0.1 to 5% by weight in total.

In case of using different surface active agents in the upper heat-sensitive layer and the lower layer, respectively, it is also desirable to use the surface active agent for improving the image-forming property in the upper heat-sensitive layer and to use the for improving the coated surface state in the lower layer. The amount added to each layer in such a case is preferably from 0.05 to 15% by weight, and more preferably from 0.1 to 5% by weight.

It is more desirable to use the surface active agent for improving the image-forming property and the surface active agent for improving the coated surface state together in the upper light-sensitive layer, and to use the surface active agent for improving the coated surface state in the lower layer. In this case, the surface active agent for improving the image-forming property in the upper heat-sensitive layer is different from the surface active agent for improving the coated surface state in the lower layer, but the surface active agents for improving the coated surface state contained in the upper heat-sensitive layer and the lower layer may be same or different.

The amount added to each layer in such a case is preferably from 0.05 to 15% by weight, and preferably from 0.1 to 5% by weight. A ratio of the two kinds of surface active agents in the upper heat-sensitive layer is in the range of from 5/95% by weight to 95/5% by weight. Furthermore, it is preferred that the amount of surface active agent added to the upper heat-sensitive layer is larger than the amount of surface active agent added to the lower layer. This is because, for imparting the alkali developer resistance to the vicinity of the surface, a relatively large amount of the surface active agent for improving the image-forming property is used in the upper heat-sensitive layer.

When the amount of the surface active agent added is less than the above-described range, the improvement effects in image-forming faculty and coated surface state may be reduced. When the amount of the surface active agent added is larger than the above-described range, there is a possibility of lowering the sensitivity.

<Alkali-soluble High Molecular Compound>

In the invention, the water-insoluble and alkali-soluble resin (hereinafter sometimes properly referred to as an alkali-soluble high molecular compound) used in the upper heat-sensitive layer and the lower layer includes a homopolymer or copolymer containing an acidic group in the main chain and/or the side chain thereof and a mixture thereof. Accordingly, the upper heat-sensitive layer and the lower layer for use in the invention have a feature of dissolving upon contact with an alkaline developer.

There is no particular restriction on the alkali-soluble high molecular compound for use in the lower layer and the upper heat-sensitive layer of the invention and those hitherto known can be used. A high molecular compound having any one of functional groups of (1) a phenolic hydroxyl group, (2) a sulfonamido group and (3) an active imido group in the molecule thereof is preferred. Examples thereof are described below, however, the invention is not limited thereto.

(1) Examples of the high molecular compound having a phenolic hydroxyl group include novolak resins such as phenolformaldehyde resin, m-cresolformaldehyde resin, p-cresolformaldehyde resin, m-/p-mixed cresolformaldehyde resin and phenol/cresol (the cresol may be any one of m-cresol, p-cresol and m-/p-mixed cresol) mixed formaldehyde resin, etc., and pyrogallol acetone resins. As the high molecular compound having a phenolic hydroxyl group, high molecular compounds each having a phenolic hydroxyl group in the side chain are also preferably used. As the high molecular compound each having a phenolic hydroxyl group in the side chain include high molecular compounds obtained by homopolymerizing a polymerizable monomer of a low molecular compound having one or more phenolic hydroxyl groups and one or more polymerizable unsaturated bonds, or copolymerizing such a monomer with other polymerizable monomer.

Examples of the polymerizable monomer having a phenolic hydroxyl group include an acrylamide, a methacrylamide, an acrylic acid ester and a methacrylic acid ester each having a phenolic hydroxyl group and a hydroxystyrene. Specific examples thereof include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate and 2-(4-hydroxyphenyl)ethyl methacrylate. These resins having a phenolic hydroxyl group may be used singly or as a combination of two or more kinds thereof. Furthermore, a condensation polymerization product of a phenol containing an alkyl group having from 3 to 8 carbon atoms as a substituent with formaldehyde, for example, tert-butylphenolformaldehyde resin or octylphenolformaldehyde resin as described in U.S. Pat. No. 4,123,279 may be used together.

(2) As the alkali-soluble high molecular compound having a sulfonamido group include high molecular compounds obtained by homopolymerizing a polymerizable monomer having a sulfonamide group, or copolymerizing such a monomer with other polymerizable monomer. Examples of the polymerizable monomer having a sulfonamido group include a polymerizable monomer of a low molecular compound having at least one sulfonamido group —NH—$SO_2$—, wherein at least one hydrogen atom is bonded onto the nitrogen atom, and one or more polymerizable unsaturated bond in one molecule. Among these compounds, low molecular compounds having an acryloyl group, an allyl group or a vinyloxy group, and an unsubstituted or monosubstituted aminosulfonyl group or a substituted sulfonylimino group are preferred.

(3) The alkali-soluble high molecular compound having an active imido group preferably has the active imido group in the molecule. Examples of such a high molecular compound include high molecular compounds obtained by homopolymerizing a polymerizable monomer of a low molecular compound having one or more active imido groups and one or more polymerizable unsaturated bonds in the molecule, or copolymerizing such a monomer with other polymerizable monomer.

Specific examples of such a compound, which can be suitably used, include N-(p-toluenesulfonyl)methacrylamide and N-(p-toluenesulfonyl)acrylamide.

Furthermore, as the alkali-soluble high molecular compound for use in the invention, a high molecular compound obtained by polymerizing two or more kinds of the polymerizable monomer having a phenolic hydroxyl group, the polymerizable monomer having a sulfonamido group and the polymerizable monomer having an active imido group, or a high molecular compound obtained by copolymerizing two or more of these polymerizable monomers with other polymerizable monomer is preferably used. In the case of copolymerizing the polymerizable monomer having a phenolic hydroxyl group with the polymerizable monomer having a sulfonamido group and/or the polymerizable monomer having an active imido group, a compounding weight ratio of the former monomer to the latter monomer(s) is preferably in the range of from 50:50 to 5:95, and particularly preferably from 40:60 to 10:90.

In the invention, when the alkali-soluble high molecular compound is the copolymer of the polymerizable monomer having a phenolic hydroxyl group, the polymerizable monomer having a sulfonamido group or the polymerizable monomer having an active imido group with other polymerizable monomer, the monomer of imparting alkali solubility is preferably contained in an amount of at least 10 mol % and more preferably at least 20 mol %. When the amount of the copolymerization component is less than 10 mol %, the alkali solubility is liable to become insufficient and the effect of improving the development latitude is not sufficiently attained in some cases.

Examples of the monomer component copolymerized with the polymerizable monomer having a phenolic hydroxyl group, the polymerizable monomer having a sulfonamido group or the polymerizable group having an active imido group include the compounds set forth in the following (m1) to (m12), however, the invention is not limited thereto.

(m1) Acrylic acid esters and methacrylic acid esters having an aliphatic hydroxyl group, for example, 2-hydroxyethyl acrylate, and 2-hydroxyethyl methacrylate.

(m2) Alkyl acrylates, for example, methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(m3) Alkyl methacrylates, for example, methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(m4) Acrylamides and methacrylamides, for example, acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(m5) Vinyl ethers, for example, ethyl vinyl ether, 2-chloroethyl vinyl ether, hydroxyethyl vinyl ether, propyl vinyl ether, butyl vinyl ether, octyl vinyl ether and phenyl vinyl ether.

(m6) Vinyl esters, for example, vinyl acetate, vinyl chloroacetate, vinyl butyrate and vinyl benzoate.

(m7) Styrenes, for example, styrene, α-methylstyrene, methyl styrene, and chloromethylstyrene.

(m8) Vinyl ketones, for example, methyl vinyl ketone, ethyl vinyl ketone, propyl vinyl ketone and phenyl vinyl ketone.

(m9) Olefins, for example, ethylene, propylene, isobutylene, butadiene and isoprene.

(m10) N-vinylpyrrolidone, acrylonitrile, and methacrylonitrile.

(m11) Unsaturated imides, for example, maleimide, N-acryloylacrylamide, N-acetylmethacrylamide, N-propionylmethacrylamide and N-(p-chlorobenzoyl) methacrylamide.

(m12) Unsaturated carboxylic acids, for example, acrylic acid, methacrylic acid, maleic anhydride, and itaconic acid.

The alkali-soluble high molecular compound preferably has a phenolic hydroxyl group in the point of excellent in the image-forming property by the exposure of an infrared laser, etc., and examples thereof include novolak resins such as phenolformaldehyde resin, m-cresolformaldehyde resin, p-cresolformaldehyde resin, m-/p-mixed cresolformaldehyde resin and phenol/cresol (the cresol may be m-cresol, p-cresol or m-/p-mixed cresol) mixed formaldehyde resin, and pyrogallol acetone resins.

Also, examples of the alkali-soluble high molecular compound having a phenolic hydroxyl group include condensation polymerization products of formaldehyde with a phenol containing an alkyl group having from 3 to 8 carbon atoms as a substituent, such as, tert-butylphenolformaldehyde resin and octylphenolformaldehyde resin, as described in U.S. Pat. No. 4,123,279.

As a method of copolymerizing the alkali-soluble high molecular compound, a graft copolymerization method, a block copolymerization method, a random copolymerization method, etc., which have hitherto been known, can be used.

In the invention, when the alkali-soluble high molecular compound is a homopolymer or copolymer of the polymerizable monomer having a phenolic hydroxyl group, the polymerizable monomer having a sulfonamido group or the polymerizable monomer having an active imido group, the high molecular compound having a weight average molecular weight of at least 2,000 and a number average molecular weight of at least 500 is preferred. More preferably, the weight average molecular weight is from 5,000 to 300,000, the number average molecular weight is from 800 to 250,000 and a dispersion degree (weight average molecular weight/number average molecular weight) is from 1.1 to 10.

Also, in the invention, when the alkali-soluble polymer is a resin such as a phenolformaldehyde resin or a cresolaldehyde resin, the polymer having a weight average molecular weight of from 500 to 20,000 and a number average molecular weight of from 200 to 10,000 is preferred.

As the alkali-soluble high molecular compound for use in the lower layer, an acrylic resin is preferred. Furthermore, the acrylic resin having a sulfonamido group is particularly preferred.

Also, as the alkali-soluble high molecular compound for used in the upper heat-sensitive layer, a resin having a phenolic hydroxyl group is desirable in the point that in the non-exposed area, a strong hydrogen bonding occurs and in the exposed area, the hydrogen bond of a part is easily released. A novolac resin is more preferred.

The alkali-soluble high molecular compounds may be used singly or as a combination of two or more thereof. The amount of the alkali-soluble high molecular compound added is from 30 to 99% by weight, preferably from 40 to 95% by weight, and particularly preferably from 50 to 90% by weight based on the whole solid components of the above-described heat-sensitive layer. When the amount of the alkali-soluble high molecular compound added is less than 30% by weight, the durability of the heat-sensitive layer is deteriorated, while, when the amount added exceeds 99% by weight, it is undesirable in both the sensitivity and the durability.

<Infrared Absorbing Dye>

In the invention, there is no particular restriction on the infrared absorbing dye for use in the upper heat-sensitive layer, as far as the dye absorbs infrared light to generate heat, and various dyes known as infrared absorbing dyes can be used.

As the infrared absorbing dye, which can be used in the invention, commercially available dyes and known dyes described in publications (for example, *Senryo Binran* (*Handbook of Dyes*), compiled by Yuki Gosei Kagaku Kyokai (1970)) can be utilized. Spedific examples thereof include dyes, for example, azo dyes, metal complex salt azo dyes, pyrazolone azo dyes, anthraquinone dyes, phthalocyanine dyes, carbonium dyes, quinoneimine dyes, methine dyes, cyanine dyes, etc. In the invention, among these dyes, the dyes absorbing infrared light or near infrared light are particularly preferred in the point that they are suitable for use with a laser emitting infrared or near infrared light.

Examples of the dyes of absorbing infrared or near infrared light include the cyanine dyes described in JP-A-58-125246, JP-A-59-84356, JP-A-59-202829 and JP-A-60-78787, the methine dyes described in JP-A-58-173696, JP-A-58-181690 and JP-A-58-194595, the naphthoquinone dyes described in JP-A-58-112793, JP-A-58-224793, JP-A-59-48187, JP-A-59-73996, JP-A-60-52940 and JP-A-60-63744, the squarylium dyes described in JP-A-58-112792 and the cyanine dyes described in British Patent 434,875.

Also, the near infrared absorbing sensitizers described in U.S. Pat. No 5,156,938 are suitably used as the dyes, and also other examples of the dyes for use in the invention include the substituted arylbenzo(thio)pyrylium salts described in U.S. Pat. No. 3,881,924, the trimethinethiapyrylium salts described in JP-A-57-142645 (U.S. Pat. No. 4,327,169), the pyrylium-base compounds described in JP-A-58-181051, JP-A-58-220143, JP-A-59-41363, JP-A-59-84248, JP-A-59-84249, JP-A-59-146063 and JP-A-59-146061, the cyanine dyes described in JP-A-59-216146, the pentamethinethiopyrylium salts described in U.S. Pat. No. 4,283,475, the pyrylium compounds described in JP-B-5-13514 and JP-B-5-19702 (the term "JP-B" as used herein means an "examined Japanese patent publication"), and as commercially available products, for example, Epolight III-178, Epolight III-130 and Epolight III-125 (manufactured by Epolin Inc.), etc., are particularly preferably used.

Other particularly preferred examples of the dyes include near infrared absorbing dyes represented by formulae (I) and (II) described in U.S. Pat. No. 4,756,993.

The infrared absorbing dye can be added not only to the upper heat-sensitive layer but also to the lower layer. By adding the infrared absorbing dye to the lower layer, the lower layer can also function as a heat-sensitive layer. In the case of adding the infrared absorbing dye to the lower layer, the dye may be the same as or different from the infrared absorbing dye added to the upper heat-sensitive layer.

Also, the infrared absorbing dye may be added to a layer containing other components, or another layer, which is additionally formed. In the case of forming another layer, the layer is preferably a layer adjacent to the upper heat-sensitive layer. Also, the dye and the above-described alkali-soluble resin are preferably contained in the same layer but may be contained in different layers respectively.

The amount of dye added is from 10 to 50% by weight, preferably from 10 to 20% by weight based on the total solid components of the upper heat-sensitive layer. When the addition amount of the dye is less than 10% by weight, the sensitivity tends to decrease, whereas when it exceeds 50 wt %, the sensitivity is greatly lowered, the uniformity of the heat-sensitive layer is lost and the durability of heat-sensitive layer is deteriorated.

Also, the amount of the dye added to the lower layer is from 0 to 10% by weight, preferably from 0 to 6% by weight, and more preferably from 0.1 to 5% by weight to the total solid components of the lower layer. When the amount of the dye added exceeds 10% by weight, the sensitivity tends to decrease.

<Other Components>

In the formation of the positive working heat-sensitive layer or the lower layer, various additives can be added, if desired, in addition of the above-described indispensable components, insofar as the effects of the invention are not impaired. The additives may be added to the lower layer only or to the upper heat-sensitive layer only. Furthermore, the additives may be added to both the layers. Examples of the additives are described below.

The use of a substance, which is heat decomposable, and in the non-decomposed state, substantially reduces the solubility of the alkali-soluble high molecular compound, for example, an onium salt, an o-quinonediazide compound, an aromatic sulfone compound, or an aromatic sulfonic acid ester compound, together with the above-described components is preferred for improving the dissolution inhibiting property of image areas in a developer and improving the surface hardness. Examples of the onium salt include diazonium salts, ammonium salts, phosphonium salts, iodonium salts, sulfonium salts, selenonium salts and arsonium salts.

Suitable examples of the onium salt for use in the invention include the diazonium salts described in S. I. Schlesinger, *Photogr. Sci. Eng.*, 18, 387 (1974), T. S. Bal et al., *Polymer*, 21, 423 (1980), and JP-A-5-158230, the ammonium salts described in U.S. Pat. Nos. 4,069,055 and 4,069,056, and JP-A-3-140140, the phosphonium salts described in D. C. Necker et al., *Macromolecules*, 17, 2468 (1984), C. S. Wen et al., *Teh, Proc. Conf. Rad. Curing ASIA*, p. 478, Tokyo, October (1988), and U.S. Pat. Nos. 4,069,055 and 4,069,056, the iodonium salts described in J. V. Crivello et al., *Macromolecules*, 10 (6), 1307 (1977), *Chem. & Eng. News*, Nov. 28, p. 31 (1988), European Patent 104,143, U.S. Pat. Nos. 339,049 and 410,201, JP-A-2-150848 and JP-A-2-296514, the sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et-al., *J. Polymer Sci., Polymer Chem. Ed.*, 17, 2877 (1979), European Patents 370,693, 233,567, 297,443 and 297,442, U.S. Pat. Nos. 4,933,377, 3,902,114, 410,201, 339,049, 4,760,013, 4,734,444 and 2,833,827, and German Patents 2,904,626, 3,604,580 and 3,604,581, the selenonium salts described in J. V. Crivello et al., *Macromolecules*, 10 (6), 1307 (1977), and J. V. Crivello et al., *J. Polymer Sci., Polymer Chem. Ed.*, 17, 1047 (1979), and arsonium salts described in C. S. Wen et al., *Teh, Proc. Conf. Rad. Curing ASIA*, p. 478, Tokyo, October (1988).

Among the onium salts, diazonium salt is particularly preferred. Particularly preferred examples of the diazonium salt include those described in JP-A-5-158230.

Examples of the counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid and para-toluenesulfonic acid. Among these compounds, hexafluorophosphoric acid, and alkylaromatic sulfonic acids, for example, triisopropylnaphthalenesulfonic acid and 2,5-dimethylbenzenesulfonic acid are particularly preferred.

Preferred examples of the quinonediazides include o-quinonediazide compounds. The o-quinonediazide compound for use in the present invention is a compound having at least one o-quinonediazido group, which increases the alkali solubility upon thermal decomposition, and compounds having various structures can be used. Specifically, o-quinonediazide assists the dissolution of the photosensitive system by the two effects, namely, the o-quinonediazide loses the capability of inhibiting the dissolution of the binder upon thermal decomposition and the o-quinonediazide itself changes into an alkali-soluble substance. Examples of the o-quinonediazide compound, which can be used in the present invention, include the compounds described in J. Kosar, *Light-Sensitive Systems*, pp. 339–352, John Wiley & Sons, Inc. In particular, sulfonic acid esters or sulfonic acid amides of o-quinonediazide, obtained by reacting with various aromatic polyhydroxy compounds or aromatic amino compounds, are preferred. Also, the ester of benzoquinone-(1,2)-diazidosulfonic chloride or naphthoquinone-(1,2)-diazide-5-sulfonic chloride with a pyrogallol-acetone resin described in JP-B-43-28403, and the ester of benzoquinone-(1,2)-diazidosulfonic chloride or naphthoquinone-(1,2)-diazido-5-sulfonic chloride with a phenol-formaldehyde resin described in U.S. Pat. Nos. 3,046,120 and 3,188,210 are suitably used.

Furthermore, an ester of naphthoquinone-(1,2)-diazido-4-sulfonic chloride with a phenol-formaldehyde resin or cresol-formaldehyde resin, and an ester of naphthoquinone-(1,2)-diazido-4-sulfonic chloride with a pyrogallol-acetone resin are also suitably used. Other useful o-quinonediazide compounds are described in a large number of patents. For example, there are those described in JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,825, British Patents 1,227,602, 1,251,345, 1,267,005, 1,329,888 and 1,330,932, and German Patent 854,890.

The amount of the o-quinonediazide compound added is preferably from 1 to 50% by weight, more preferably from 5 to 30% by weight, and particularly preferably from 10 to 30% by weight, based on the total solid components of the layer. The compounds may be used singly or as a mixture of two or more thereof.

The amount of the additive other than the o-quinonediazide compound is preferably from 1 to 50% by weight, more preferably from 5 to 30% by weight, and particularly preferably from 10 to 30% by weight. It is preferred that the additives and the alkali-soluble high molecular compound for use in the invention are incorporated in the same layer.

Also, for intensifying the discrimination (the discriminating property of hydrophobic property/hydrophilic property) of image or enhancing the resistance of the surface against scratches, the polymer having, as a polymerization component, a (meth)acrylate monomer containing two or three perfluoroalkyl groups each having from 3 to 20 carbon atoms in the molecule thereof as described in JP-A-2000-187318 is preferably used together. Such a polymer may be incorporated in either the lower layer or the upper heat-sensitive layer but it is more effective to incorporate such a compound in the heat-sensitive layer disposed at the upper portion.

The amount of the compound added is preferably from 0.1 to 10% by weight, more preferably from 0.5 to 5% by weight, based on the total solid components of the layer.

In the printing plate precursor of the invention, a compound capable of decreasing the coefficient of static friction on the surface may be added for the purpose of imparting resistance against scratches. Specific examples thereof include long-chain alkyl carboxylic acid esters as described in U.S. Pat. No. 6,117,913. Such a compound may be incorporated in either the lower layer or the upper heat-sensitive layer but it is more effective to incorporate the compound in the upper heat-sensitive layer disposed at the upper portion.

The amount of the compound added is preferably from 0.1 to 10% by weight, and more preferably from 0.5 to 5% by weight, based on the total solid components of the layer.

Also, in the invention, the lower layer or the upper heat-sensitive layer may contain, if desired, a low molecular weight compound having an acidic group. Examples of the acidic group include a sulfonic acid group, a carboxylic acid group and a phosphoric acid group. Among these compounds, a compound having a sulfonic acid group is preferred. Specific examples thereof include aromatic sulfonic acids, for example, p-toluenesulfonic acid or naphthalenesulfonic acid and aliphatic sulfonic acids.

Such a compound may be incorporated in either of the lower layer and the upper heat-sensitive layer. The amount of the compound added is preferably from 0.05 to 5% by weight, and more preferably from 0.1 to 3% by weight, based on the total solid components of the layer. When the amount exceeds 5% by weight, the solubility of each layer in the developer is undesirably increased.

Further, in the invention, for controlling the solubility of the lower layer or the upper heat-sensitive layer, the layer may contain various dissolution inhibitors other than the above-described compounds. As such a dissolution inhibitor, the disulfone compounds or sulfone compounds as described in JP-A-11-119418 are suitably used.

Such a compound may be incorporated in either of the lower layer and the upper heat-sensitive layer. The amount of the compound added is preferably from 0.05 to 20% by weight, and more preferably from 0.5 to 10% by weight, based on the total solid components of the layer.

For the purpose of further increasing the sensitivity, cyclic acid anhydrides, phenols or organic acids may be used together. Examples of the cyclic acid anhydride include phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride and pyromellitic anhydride described in U.S. Pat. No. 4,115,128. Examples of the phenol include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane. Furthermore, examples of the organic acid include the sulfonic acids, sulfinic acids, alkylsulfuric acids, phosphonic acids, phosphoric acid esters and carboxylic acids described in JP-A-60-88942 and JP-A-2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid. The content of the cyclic acid anhydride, phenol or organic acid is preferably from 0.05 to 20% by weight, more preferably from 0.1 to 15% by weight, and particularly preferably from 0.1 to 10% by weight, based on the total solid components of the layer.

The lower layer or upper heat-sensitive layer for use in the invention may contain a printing-out agent for obtaining a visible image immediately after heating upon exposure, or a dye or pigment serving as an image-coloring agent.

A representative example of the printing out agent includes a combination of a compound capable of releasing an acid under heating by light exposure (photo-acid releasing agent) and an organic dye capable of forming-a-salt. Specific examples thereof include the combinations of o-naphtho-quinonediazido-4-sulfonic acid halogenide and the salt-forming organic dyes described in JP-A-50-36209 and JP-A-53-8128, and the combinations of trihalomethyl compounds and the salt-forming organic dyes described in JP-A-53-36223, JP-A-54-74728, JP-A-60-3626, JP-A-61-143748, JP-A-61-151644 and JP-A-63-58440. The trihalomethyl compounds include oxazole compounds and the triazine compounds, and both compounds have excellent storage stability and give a clear print-out image.

As the image-coloring agent, in addition to the above-described salt-forming organic dyes, other dyes can be used. Preferred dyes include oil-soluble dyes and basic dyes including the salt-forming organic dye. Specific examples thereof include Oil Yellow #101, Oil Yellow #103, Oil Ping #312, Oil Green BG, Oil Blue BOS, Oil Blue #603, Oil Black BY, Oil Black BS, Oil Black T-505 (all manufactured by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000) and Methylene Blue (CI52015). Also the dyes described in JP-A-62-293247 are particularly preferred. The dye can be added to the printing plate precursor in an amount of from 0.01 to 10% by weight, and preferably from 0.1 to 3% by weight, based on the total solid components of the printing plate precursor.

Furthermore, in the printing plate precursor of the invention, a plasticizer is added, if desired, so as to impart flexibility or the like to the coated film. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid.

The upper heat-sensitive layer and the lower layer of the lithographic printing plate precursor each can be formed by dissolving the above-described components in a solvent and coating the resulting solution on an appropriate support.

Examples of the solvent used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone and toluene, however, the invention is not limited thereto. The solvents may be used singly or as a mixture thereof.

Also, the solvent used for coating is preferably selected such that the solubility of the solvent to the alkali-soluble high molecular compound used in the upper heat-sensitive layer is different from the solubility of the solvent to the alkali-soluble high molecular compound used in the lower layer. That is, when after coating the lower layer, the heat-sensitive layer as the upper layer is coated adjacently thereto, if a solvent capable of dissolving the alkali-soluble high molecular compound of the lower layer is used as the solvent for coating of the upper layer, the mixing at the interface between layers cannot be neglected and in the extreme case, a uniform single layer is formed without forming double layers. When two adjacent layers are mixed at the interface or mingle with each other to show a behavior like a uniform layer, there is a possibility that the effect of the invention obtained by having two layers is undesirably impaired. Accordingly, it is desirable that the solvent used for coating of the upper heat-sensitive layer is a poor solvent for the alkali-soluble high molecular compound contained in the lower layer.

The concentration of the above-described components (total solid components including additives) in the solvent in the case of coating each layer is preferably from 1 to 50% by weight.

The coated amount (solid components) of the upper heat-sensitive layer on the support obtained after coated and drying may vary depending upon the use, but it is preferable that the coated amount of the heat-sensitive layer is from 0.05 to 1.0 $g/m^2$ and the coated amount of the lower layer is from 0.3 to 3.0 $g/m^2$. When the coated amount of heat-sensitive layer is less than 0.05 $g/m^2$, the image-forming property may deteriorate, whereas when it exceeds 1.0 $g/m^2$, there is a possibility that the sensitivity is lowered. Also when the coated amount of the lower layer is outside the above-described range. i.e., is less than or more than the above-described range, the image-forming property is liable to deteriorate. Also, the total coated amounts of the above-described two layers are preferably from 0.5 to 3.0 $g/m^2$. When the total coated amounts are less than 0.5 $g/m^2$, the film characteristics are reduced, whereas when the amounts exceed 3.0 $g/m^2$, the sensitivity is liable to be lowered. As the coated amount is smaller, the apparent sensitivity becomes higher but the film characteristics of the photosensitive film are lowered.

As the method of coating, various methods can be used, and for example, there are bar coater coating, rotary coating, spray coating, curtain coating, dip coating, air-knife coating, blade coating, and roll coating.

Into the lower layer or the upper heat-sensitive layer in the invention, a surface active agent such as the fluorine-containing surface active agent as described in JP-A-62-170950 can be added for improving the coating property. The amount is such a surface active agent is preferably from 0.01 to 1% by weight, and more preferably from 0.05 to 0.5% by weight, based on the total solid components in the lower layer or the upper heat-sensitive layer.

<Support>

The support used for the lithographic printing plate precursor of the invention is a dimensionally stable plate-like material having necessary strength and durability. Examples thereof include paper, paper laminated with plastic (for example, polyethylene, propylene or polystyrene), a metal plate (e.g., aluminum, zinc or copper plate), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film), and paper or plastic film having laminated or deposited thereon a metal as described above.

The support for use in the invention is preferably a polyester film or an aluminum plate. Among them, the aluminum plate is more preferred, since it is dimensionally stable and relatively inexpensive. The aluminum plate is preferably a pure aluminum plate or an alloy plate made of aluminum as the main constituent and containing trace amounts of foreign elements. A plastic film having laminated or deposited thereon aluminum may also be used. Examples of the foreign elements contained in the aluminum alloy include silicon, iron, manganese, copper, magnesium, chromium, zinc, bismuth, nickel and titanium. The content of foreign element in the alloy is at most 10% by weight or less.

In the invention, particularly preferred aluminum is pure aluminum but since perfectly pure aluminum is difficult to produce in view of refining technique, the aluminum may contain a slight amount of foreign element.

The aluminum plate for use in the invention is not particularly limited on the composition and aluminum plates, which have hitherto been known and commonly used, can be appropriately utilized. The thickness of the aluminum plate for use in the invention is approximately from 0.1 to 0.6 mm, preferably from 0.15 to 0.4 mm, and more preferably from 0.2 to 0.3 mm.

In advance of surface-roughening an aluminum plate, a degreasing treatment using, for example, a surfactant, an organic solvent or an alkaline aqueous solution is performed, if desired, in order to remove the rolling oil on the surface. The surface roughening treatment of the aluminum plate is performed by various methods, for example, by a method of mechanically roughening the surface, a method of electrochemically dissolving and roughening the surface, or a method of chemically dissolving selectively the surface. In the mechanical method, a known method, for example, ball graining, brush graining, blast graining or buff graining may be used. The electrochemical surface roughening method includes a method of performing the treatment by passing an alternating current or direct current through an electrolytic solution containing hydrochloric acid or nitric acid. A method using these two treatments in combination as described in JP-A-54-63902 may also be used. After such surface roughening, the aluminum plate is, if desired, subjected to an alkali etching treatment and a neutralization treatment and then, if desired, to an anodizing treatment to enhance the water retentivity or abrasion resistance on the surface. The electrolyte, which can be used in the anodizing treatment of the aluminum plate, includes various electrolytes capable of forming a porous oxide film, and sulfuric acid, phosphoric acid, oxalic acid, chromic acid or a mixed acid thereof is ordinarily used. The concentration of the electrolyte is appropriately determined depending on the kind of electrolyte.

The anodizing treatment conditions vary depending on the electrolyte used and therefore, cannot be indiscriminately specified, however, suitable conditions are ordinarily such that the concentration of electrolyte is from 1 to 80 wt %, the liquid temperature is from 5 to 70° C., the current density is from 5 to 60 $A/dm^2$, the voltage is from 1 to 100 V, and the electrolysis time is from 10 seconds to 5 minutes. When the amount of anodized film is less than 1.0 $g/m^2$, the press life may be insufficient or the non-image area of lithographic printing plate is readily scratched to cause so-called "scratch toning", namely, adhesion of ink to the scratched part at the printing. After the anodizing treatment, the aluminum surface is, if desired, subjected to a hydrophilic treatment. Examples of the hydrophilic treatment for use in the present invention include a method of using an alkali metal silicate (for example, an aqueous sodium silicate solution) described in U.S. Pat. Nos. 2,714,066, 3,181,461, 3,280,734 and 3,902,734. According to the method, the support is immersed or electrolyzed in an aqueous sodium silicate solution. Further, a method of treating the support with potassium fluorozirconate disclosed in JP-B-36-22063 or with polyvinylphosphonic acid described in U.S. Pat. Nos. 3,276,868, 4,153,461 and 4,689,272 may be used.

The lithographic printing plate precursor of the invention comprises at least two layers of the upper heat-sensitive layer and the lower layer on a support but, if desired, an undercoat layer may be provided between the support and the lower layer.

Various organic compounds are used as components-of the undercoat layer and examples thereof include carboxymethyl cellulose; dextrin; gum arabic; phosphonic acids having an amino group, e.g., 2-aminoethylphosphonic acid; organic phosphonic acids, e.g., phenylphosphonic acid, naphthylphosphonic acid, alkyl phosphonic acid, glycerophosphonic acid, methylenediphosphonic acid and ethylenediphosphonic acid, each of which may have a substituent; organic phosphoric acids, e.g., phenylphosphoric acid, naphthylphosphoric acid, alkylphosphoric acid and glycerophosphoric acid, each of which may have a substituent; organic phosphinic acids, e.g., phenylphosphinic acid, naphthylphosphinic acid, alkylphosphinic acid and glycerophosphinic acid, each of which may have a substituent; amino acids, e.g., glycine and β-alanine; and hydrochlorides of amine having a hydroxy group, e.g., hydrochloride of triethanolamine. The compounds may be used as a mixture of two or more thereof.

The organic undercoat layer can be provided by a method of dissolving the above-described organic compound in water, an organic solvent, e.g., methanol, ethanol or methyl ethyl ketone, or a mixed solvent thereof, coating the solution on an aluminum plate and drying it, or a method of dissolving the organic compound in water, an organic solvent, e.g., methanol, ethanol or methyl ethyl ketone, or a mixed solvent thereof, immersing an aluminum plate in the solution to adsorb the compound, washing the aluminum plate with water or the like, and drying it. In the former method, the solution containing the organic compound in a concentration of 0.005 to 10% by weight can be coated by various methods. In the latter method, the concentration of the solution is from 0.01 to 20% by weight, preferably from 0.05 to 5% by weight, the immersion temperature is from 20 to 90° C., preferably from 25 to 50° C., and the immersion time is from 0.1 second to 20 minutes, preferably from 2 seconds to 1 minute. The solution used may also be adjusted its PH to a range of from 1 to 12 with a basic substance, e.g., ammonia, triethylamine or potassium hydroxide or by an acidic substance, e.g., hydrochloric acid or phosphoric acid.

The coverage of the organic undercoat layer is suitably from 2 to 200 $mg/m^2$, preferably from 5 to 100 $mg/m^2$. When the coverage is less than 2 $mg/m^2$, sufficiently high printing durability cannot be obtained and when it exceeds 200 $mg/m^2$, the same problem also occurs.

The positive working lithographic printing plate precursor is imagewise exposed and then subjected to development according to the plate-making method described below.

Examples of the light source of emitting active light for use in the imagewise exposure include mercury lamp, metal halide lamp, xenon-lamp, chemical lamp and carbon arc-lamp. Examples of the radiation include electron beam, X ray, ion beam and far infrared ray. Also, g line, i line, deep-UV light or high-density energy beam (laser beam) may be used. Examples of the laser beam include helium-neon laser, argon laser, krypton laser, helium-cadmium laser and KrF excimer laser. In the invention, a light source having an emission wavelength in the region from near infrared to infrared is preferred, and a solid laser or a semiconductor layer is more preferred.

A developer and replenisher used in the development of lithographic printing plate precursor in the plate-making method according to the invention is preferably a conventionally known alkali developer mainly comprising an organic compound having a buffering activity and a base and containing substantially no silicon dioxide. Such a developer is hereinafter referred to as a "non-silicate developer". The term "containing substantially no silicon dioxide" as used herein means that a slight amount of silicon dioxide as unavoidable impurity or by-product is allowed to be present.

By using the non-silicate developer in the step of developing the lithographic printing plate precursor in the plate-making method according to the present invention, the effect of preventing generation of scratches is achieved and a good lithographic printing plate having no defect in the image area can be obtained. The developer preferably has a pH of 12.5 to 13.5.

The "non-silicate developer" for use in the plate-making method of the present invention mainly comprises an organic compound having a buffering activity and a base, as described above. Examples of the organic compound having a buffering activity include the compounds having a buffering activity described in JP-A-8-220775, for example, sugars (particularly, those represented by formulae (I) and (II)), oximes (particularly those represented by formula (III)), phenols (particularly those represented by formula (IV)) and fluorinated alcohols (particularly those represented by formula (V)). Among the compounds represented by formulae (I) to (V), those preferred are sugars represented by formulae (I) and (II) and phenols represented by formula (V), and those more preferred are non-reducing sugar, e.g., saccharose of the sugars represented by formulae (I) and (II) and sulfosalicylic acid. The non-reducing sugar includes trehalose-type oligosaccharides where reducing groups are bonded to each other, glycosides where a reducing group of the sugar is bonded to a non-sugar, and sugar alcohols obtained by reducing a sugar with hydrogenation. Any of these compounds are preferably used in the present invention.

Examples of the trehalose-type oligosaccharide include saccharose and trehalose. Examples of the glycosides include alkyl glycoside, phenol glycoside and mustard oil glycoside.

Examples of the sugar-alcohol include D,L-arabitol, ribitol, xylitol, D,L-sorbitol, D,L-mannitol, D,L-iditol, D,L-talitol, dulcitol and allodulcitol.

In addition, maltitol obtained by hydrogenation of disaccharide, and a reduction product (reduced starch syrup) obtained by hydrogenation of oligosaccharide may be preferably used.

Among these non-reducing sugars, sugar-alcohol and saccharose are preferred, and D-sorbitol, saccharose and reduced starch syrup are more preferred because they have a buffering activity in an appropriate pH region.

The non-reducing sugars may be used individually or in combination of two or more thereof. The amount of the non-reducing sugar in the developer is preferably from 0.1 to 30% by weight, more preferably from 1 to 20% by weight.

The base used in combination with the organic compound having a buffering activity can be appropriately selected from conventionally known alkali agents.

Examples of the alkali agent include inorganic alkali agents, for example, sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate and ammonium borate, and potassium citrate, tripotassium citrate and sodium citrate.

Other examples of the alkali agent which can be preferably used include organic alkali agents, for example, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

The alkali agents may be used individually or in combination of two or more thereof.

Among these compounds, sodium hydroxide and potassium hydroxide are preferred because the pH can be adjusted in a wide pH region by controlling the amount added thereof based on the amount of non-reducing sugar.

Furthermore, trisodium phosphate, tripotassium phosphate, sodium carbonate and potassium carbonate are also preferred because they have a buffering activity by themselves.

It is known that in the case of performing the development using an automatic developing machine, by adding an aqueous solution (replenisher) having higher alkalinity than the developer is added to the developer, a large amount of lithographic printing plate precursors can be processed without exchanging the developer in the development tank for a long period of time. In the invention, such a replenishing system is also preferably used. In the developer and the replenisher, various surfactants and organic solvents may be added, if desired, for the purpose of accelerating or inhibiting the development, dispersing the development scum, or enhancing the ink-receptivity of the image area of the lithographic printing plate. Preferred examples of the surfactant include anionic, cationic, nonionic and amphoteric surfactants. Furthermore, the developer or replenisher may contain, if desired, a reducing agent, for example, hydroquinone, resorcin or a sodium salt or potassium salt of an inorganic acid (e.g., sulfurous acid, hydrogen sulfurous acid), an organic carboxylic acid, a defoaming agent and a water softening agent.

The printing plate developed using the above-described developer and replenisher is subjected to an after-treatment with washing water, a rinsing solution containing a surfactant and the like, or a desensitizing solution containing gum arabic or a starch derivative. These treatments can be used in various combinations for the after-treatment of the lithographic printing plate precursor of the present invention.

Recently, an automatic developing machine for printing plates has been widely used in the plate-making and printing industries in order to rationalize and standardize the plate-making operation. In general, the automatic developing machine has a developing part and an after-treatment part and comprises a device for conveying a printing plate, and tanks for respective processing solutions and a spraying device. In the development processing, each processing solution pumped up by a pump is sprayed through spray nozzles to the exposed printing plate while horizontally conveying the printing plate. In recent years, a method of processing the printing plate by immersing the printing plate in processing solution tanks each filled with a processing solution while conveying the printing plate by means of guide rollers in the solution is also known. In such automatic processing, the processing can be performed while replenishing each replenisher to each processing solution in accordance with the amount of processing, the operating time or the like. Furthermore, a so-called disposable processing system of performing the processing using a substantially new processing solution can also be employed.

In the case where the lithographic printing plate obtained from the lithographic printing plate precursor of the present invention through imagewise exposure, development, water washing and/or rinsing and/or gumming has an unnecessary image area (for example, film edge mark of an original film), the unnecessary image area is eliminated. Such elimination is preferably performed by the method described, for example, in JP-B-2-13293, where an eliminating solution is applied to the unnecessary image area, allowed to stand for a predetermined time and thereafter, washed with water. However, the method described in JP-A-59-174842, where the unnecessary image area is irradiated with an active ray guided by an optical fiber and then subjected to development, can be utilized.

The thus-obtained lithographic printing plate is, if desired, coated with a desensitizing gum and then the plate can be used for printing. However, when a lithographic printing plate having higher printing durability is desired, the printing plate is subjected to a burning treatment. In the case of burning the lithographic printing plate, the plate before the burning is preferably treated with a plate burning conditioner described, for example, in JP-B-61-2518, JP-B-55-28062, JP-A-62-31859 and JP-A-61-159655.

The treatment may be performed by a method of applying the plate burning conditioner on the lithographic printing plate using a sponge or an absorbent cotton impregnated with the plate burning conditioner, a method of applying the plate burning conditioner by immersing the printing plate in a vat filled with the plate burning conditioner, or a method of applying the plate burning conditioner using an automatic coater. When the applied amount is made uniform by a squeegee or a squeegee roller after the application, more preferred results can be obtained.

An amount of the plate burning conditioner applied is ordinarily from 0.03 to 0.8 g/m$^2$ (dry weight). The lithographic printing plate applied with the plate burning conditioner is dried, if desired, and then heated at a high temperature by a burning processor (for example, a burning processor "BP-1300" commercially available from Fuji Photo Film Co., Ltd.). The heating temperature and the heating time are preferably from 180 to 300° C. and from 1 to 20 minutes, respectively, though these may be varied depending on the components constituting the image.

The lithographic printing plate after the burning treatment can be subjected, if desired, to conventional treatment, for example, water washing and gumming, however, in the case where a plate burning conditioner containing a water-soluble polymer compound or the like is used, a so-called desensitizing treatment, e.g., gumming can be omitted. The lithographic printing plate obtained through such treatments is mounted on an offset printer and used for printing of a large number of sheets.

The present invention is described in greater detail with reference to the following examples, but the present invention should not be construed as being limited thereto.

<Preparation of Support>

Using an aluminum alloy containing 0.06% by weight of Si, 0.30% by weight of Fe, 0.014% by weight of Cu, 0.001% by weight of Mn, 0.001% by weight of Mg, 0.001% by weight of Zn, 0.03% by weight of Ti, and the balance of Al and unavoidable impurities, a molten metal was prepared, and after carrying out a molten metal treatment and a filtration, an ingot of 500 mm in thickness and 1200 mm in width was prepared by a DC casting method. After scraping the surface at an average thickness of 10 mm by a surface scraper, the ingot was maintained at 550° C. for 5 hours, and when the temperature was lowered to 400° C., the ingot was rolled to a rolled plate of 2.7 mm in thickness using a hot rolling machine. Furthermore, after carrying out a heat treatment at 500° C. using a continuous annealing machine, an aluminum plate of 0.24 in thickness was prepared by cold rolling. After cutting the aluminum plate into a width of 1030 mm, the following surface treatments were continuously applied.

(a) Mechanical Graining Treatment

While supplying a suspension of abrasives (silica sand) in water having a specific gravity of 1.12 to the surface of the aluminum plate as an abrasive slurry, mechanical graining was carried out using rotating roller-form nylon brushes. The mean grain size of the abrasives was 8 μm and the maximum grain size thereof was 50 μm. The material of bristle of the nylon brush was 6·10 nylon, the length of the bristle was 50 mm, and the diameter of the bristle was 0.3 mm. The nylon brush was prepared by making many holes in the wall of a stainless steel-made cylinder having a diameter of 300 mm and bristles were planted in the holes closely. Three rotary brushes were used. The distance of two supporting rollers (diameter of 200 mm) under the brushes was 300 mm. By the brush rollers, the brushes pressed the aluminum plate until the load of a driving motor rotating the brushes became 7 kW plus to the load before pressing the aluminum plate by the brush rollers. The rotating direction of the brushes was same as the moving direction of the aluminum plate. The rotation number of the brushes was 200 rpm.

(b) Etching Treatment with Alkali Agent

The aluminum plate after the mechanical surface graining treatment described above was subjected to an etching treatment by splaying an alkali agent having a sodium hydroxide concentration of 2.6% by weight and an aluminum ion concentration of 6.5% by weight at a temperature of 70° C. to dissolve 6 $g/m^2$ of the aluminum plate. Thereafter, water washing by spraying was carried out.

(c) Desmut Treatment

A desmat treatment was carried out by spraying an aqueous solution having a nitric acid concentration of 1% by weight (containing 0.5% by weight of aluminum ion) at 30° C., and thereafter the aluminum plate was water washed by spraying. As the aqueous nitric acid solution used in the desmut treatment, a waste liquid from the following step of carrying out electrochemical graining using alternating current in an aqueous nitric acid solution was used.

(d) Electrochemical Graining Treatment

Using an alternating current of 60 Hz, an electrochemical graining treatment was continuously carried out. The electrolyte used was an aqueous solution of 10 g/liter of nitric acid (containing 5 g/liter of aluminum ion and 0.007% by weight of ammonium ion) and the temperature was 80° C. The current density was 30 $A/dm^2$ in the peak value of the electric current and the quantity of electricity was 130 $C/dm^2$ in the sum total of the quantities of electricity when the aluminum plate was anode. To an auxiliary electrode, 5% of the electric current passing from the electric source was branched.

Thereafter, water washing was carried out by spraying.

(e) Alkali Etching Treatment

The aluminum plate was subjected to an etching treatment by spraying an aqueous solution having a sodium hydroxide concentration of 26% by weight and an aluminum ion concentration of 6.5% by weight at 32° C. to dissolve 0.20 $g/m^2$, whereby smut components mainly composed of aluminum hydroxide formed in the electrochemical graining using alternating current in the above-described stage were removed and also, the edge portions of pits formed were dissolved to make the edge portions smooth. Thereafter, water washing by spraying was performed.

(f) Desmut Treatment

A desmut treatment was carried out by spraying an aqueous solution having a sulfuric acid concentration of 25% by weight (containing 0.5% by weight of aluminum ion) of 60° C., and thereafter, water washing by spraying was performed.

(g) Anodizing Treatment

An anodizing treatment was carried out using an anodizing apparatus of a two-stage feeder electrolytic treatment method (each length of the first and second electrolytic parts was 6 meters, each length of the first and second feeder parts was 3 meters, and each length of the first and second feeder electrodes was 2.4 meters). As the electrolyte supplied to the first and second electrolytic parts, sulfuric acid was used. The electrolyte had a sulfuric acid concentration of 170 g/liter (containing 0.5% by weight of aluminum ion) and a temperature of 43° C. Thereafter, water washing by spraying was performed. The final amount of the oxidized film formed was 2.7 $g/m^2$.

(h) Alkali Metal Silicate Treatment

By immersing the aluminum support obtained by anodizing treatment in an aqueous solution of 1% by weight 3# sodium silicate at a temperature of 30° C. for 10 seconds, an alkali metal silicate treatment (silicate treatment) was carried out. Thereafter, water washing by spraying was performed.

(i) Formation of Undercoat Layer

An undercoat solution having the composition described below was coated on the aluminum support after the alkali metal silicate treatment obtained above followed by drying at 80° C. for 15 seconds to form a coated film. The coverage of the coated film after drying was 15 $mg/m^2$.

<Undercoat solution composition>

| | |
|---|---|
| Compound described below | 0.3 g |
| Methanol | 100 g |
| Water | 1 g |

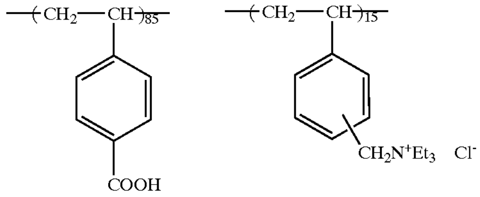

molecular weight 28,000

EXAMPLE 1

The coating solution for lower layer having the composition shown below was coated on the support described above such that the coverage became $0.85/m^2$ and dried at 140° C. for 50 seconds using PERFECT OVEN PH200, manufactured by TABAI Corp. by setting Wind Control 7. Thereafter, the coating solution for upper heat-sensitive layer having the composition shown below was coated such that the coverage became 0.15 $g/m^2$ and dried at 120° C. for one minute to obtain Lithographic printing plate precursor 1.

| (Coating solution for lower layer) | |
|---|---|
| N-(4-Aminosulfonylphenyl)methacrylamide/acrylonitrile/methyl methacrylate (36/34/30; weight average molecular weight: 50,000; acid value: 2.65) | 2.133 g |
| Cyanine dye A (having the structure shown below) | 0.109 g |
| 4,4'-Bishydroxyphenylsulfone | 0.126 g |
| Tetrahydrophthalic anhydride | 0.190 g |
| p-Toluenesulfonic acid | 0.008 g |
| 3-Methoxy-4-diazophenylamine hexafluorophosphate | 0.030 g |
| Compound obtained by replacing counter ion of Ethyl Violet with 6-hydroxynaphthalenesulfonate | 0.10 g |
| Megafac F176, manufactured by DAINIPPON INK & CHEMICALS, INC. (Fluorine-containing surfactant for improving coated surface state) | 0.035 g |
| Methyl ethyl ketone | 25.38 g |
| 1-Methoxy-2-propanol | 13.0 g |
| γ-Butyrolactone | 13.2 g |

Cyanine dye A

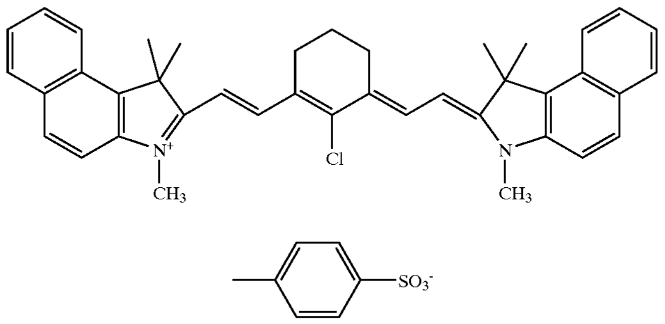

| (Coating solution for upper heat-sensitive layer) | |
|---|---|
| m,p-Cresol novolac (m/p ratio = 6/4; weight average molecular weight: 4,500; containing 0.8 wt. % of unreacted cresol) | 0.2846 g |
| Cyanine dye A (having the structure described above) | 0.075 g |
| Behenic acid amide | 0.060 g |
| Megafac F176 (20%), manufactured by DAINIPPON INK & CHEMICALS, INC. (Surfactant for improving coated surface state) | 0.022 g |
| Megafac MCF-312 (30%), manufactured by DAINIPPON INK & CHEMICALS, INC. (Fluorine-containing surfactant for improving image formation) | 0.120 g |
| Methyl ethyl ketone | 15.1 g |
| 1-Methoxy-2-propanol | 7.7 g |

EXAMPLE 2

In the same manner as in Example 1 except for using the coating solution for lower layer shown below, Llithographic printing plate precursor 2 was prepared.

| (Coating solution for lower layer) | |
|---|---|
| N-(4-Aminosulfonylphenyl)methacrylamide/acrylonitrile/methyl methacrylate (36/34/30; weight average molecular weight: 50,000; acid value: 2.65) | 1.706 g |
| m,p-Cresol novolac (m/p ratio = 6/4; weight average molecular weight: 4,500; containing 0.8 wt. % of unreacted cresol) | 0.427 g |
| Cyanine dye A (having the structure shown above) | 0.109 g |
| 4,4'-Bishydroxyphenylsulfone | 0.126 g |
| Tetrahydrophthalic anhydride | 0.190 g |
| p-Toluenesulfonic acid | 0.008 g |
| 3-Methoxy-4-diazodiphenylamine hexafluorophosphate | 0.030 g |
| Compound obtained by replacing counter ion of Ethyl Violet with 6-hydroxynaphthalenesulfonate | 0.10 g |
| Methyl ethyl ketone | 25.38 g |
| 1-Methoxy-2-propanol | 13.0 g |
| γ-Butyrolactone | 13.2 g |

EXAMPLE 3

In the same manner as in Example 1 except for using the coating solution for upper heat-sensitive layer shown below, Lithographic printing plate precursor 3 was prepared.

| (Coating solution for upper heat-sensitive layer) | |
|---|---|
| m,p-Cresol novolac (m/p ratio = 6/4; weight average molecular weight: 4,500; containing 0.8 wt. % of unreacted cresol) | 0.2846 g |
| Cyanine dye A (having the structure shown above) | 0.075 g |
| Behenic acid amide | 0.060 g |
| Megafac MCF-312 (30%), manufactured by DAINIPPON INK & CHEMICALS, INC. (Fluorine-containing surfactant for improving image formation) | 0.120 g |
| Methyl ethyl ketone | 15.1 g |
| 1-Methoxy-2-propanol | 7.7 g |

COMPARATIVE EXAMPLE 1

In the same manner as in Example 1 except for using the coating solution for upper heat-sensitive layer shown below, Lithographic printing plate precursor 4 was prepared.

| (Coating solution for upper heat-sensitive layer) | |
|---|---|
| m,p-Cresol novolac (m/p ratio = 6/4; weight average molecular weight: 4,500; containing 0.8 wt. % of unreacted cresol) | 0.2846 g |
| Cyanine dye A (having the structure shown above) | 0.075 g |
| Megafac F176 (20%), manufactured by DAINIPPON INK & CHEMICALS, INC. (Surfactant for improving coated surface state) | 0.022 g |

-continued

| (Coating solution for upper heat-sensitive layer) | |
|---|---|
| Methyl ethyl ketone | 15.1 g |
| 1-Methoxy-2-propanol | 7.7 g |

COMPARATIVE EXAMPLE 2

In the same manner as in Example 1 except for using the coating solution for upper heat-sensitive layer shown below, Lithographic printing plate precursor 5 was prepared.

| (Coating solution of upper heat-sensitive layer) | |
|---|---|
| m,p-Cresol novolac (m/p ratio = 6/4; weight average molecular weight: 4,500; containing 0.8 wt. % of unreacted cresol) | 0.2846 g |
| Cyanine dye A (having the structure shown above) | 0.075 g |
| Megafac MCF-312 (30%), manufactured by DAINIPPON INK & CHEMICALS, INC. (Fluorine-containing surfactant for improving image formation) | 0.120 g |
| Methyl ethyl ketone | 15.1 g |
| 1-Methoxy-2-propanol | 7.7 g |

<Evaluation of Lithographic Printing Plate Precursor>

(Evaluation of Development Latitude)

Using Trendsetter manufactured by Creo Inc., a test pattern was imagewise drawn on each of Lithographic printing plate precursors 1 to 3 of the invention and Lithographic printing plate precursors 4 and 5 for comparison at a beam intensity of 9 W and a drum rotation speed of 150 rpm.

Each of Lithographic printing plate precursors 1 to 5 exposed under the conditions described above was developed using PS Processor 900H, manufactured by Fuji Photo film Co., Ltd., charged with a developer DT-1 manufactured by Fuji Photo film Co., Ltd., wherein the diluting ratio was changed, at a developer temperature of 30° C. for a developing time of 12 seconds. The presence of stain or coloration caused by the residual film of the recording layer due to development inferior was confirmed, and the electric conductivity of the developer in which development could be well performed was measured. The results are shown in Table 1. The case wherein the difference between the maximum value and the minimum value is large is evaluated to be excellent in the development latitude.

(Evaluation of Scratch Resistant)

Each of Lithographic printing plate precursors 1 to 3 of the invention and Lithographic printing plate precursors 4 and 5 for comparison was scratched using a scratching test machine manufactured by HEIDON Co., by applying a load on a diamond tip (tip diameter: 1.0 mm). Then, each sample was developed with a developer prepared by diluting a developer DT-1 manufactured by Fuji Photo film Co., Ltd. such that the electric conductivity thereof indicated 45 mS/cm. The load by which the scratch formed was visually recognized was determined. AS the numerical value is larger, the scratch resistance is better.

The developer (DT-1) used contains sorbitol as the main component and a non-silicate developer.

The results of the scratch resistance evaluation are shown in Table 1.

As is clear from Table 1, Lithographic printing plate precursors 1 to 3 of the invention exhibit the good scratch resistance as compared with Lithographic printing plate precursors 4 and 5 for comparison.

(Evaluation of Dot Image Reproducibility)

Using Trendsetter manufactured by Creo Inc., a dot of 50% was drawn on each of Lithographic printing plate precursors 1 to 3 of the invention and Lithographic printing plate precursors 4 and 5 for comparison having a size of 650 mm×800 mm at a beam intensity of 9 W and a drum rotation speed of 150 rpm.

Each of Lithographic printing plate precursors 1 to 5 was then developed using PS processor 900H, manufactured by Fuji Photo film Co., Ltd., charged with a developer prepared by diluting a developer DT-1 manufactured by Fuji Photo film Co., Ltd. such that the electric conductivity thereof indicated 45 mS/cm) at a developer temperature of 30° C. for a developing time of 12 seconds. The unevenness of the image composed of dots of 50% formed was visually evaluated. The results are shown in Table 1.

TABLE 1

| | Lithographic Printing Plate Precursor | Development Latitude (Max–Min) | Scratch Resistance | Dot Image Reproducibility |
|---|---|---|---|---|
| Example 1 | 1 | 41–57 | 8 g | Good |
| Example 2 | 2 | 41–57 | 7 g | Good |
| Example 3 | 3 | 41–56 | 9 g | Good |
| Comparative Example 1 | 4 | 41–47 | 3 g | Good |
| Comparative Example 2 | 5 | 41–47 | 8 g | Poor |

Note:
Max–Min: Maximum value–Minimum value

As is clear from Table 1, the printing plate precursor of Comparative Example 1, wherein the same surface active agent, which is the surface active agent for improving the surface quality, is used in the upper heat-sensitive layer and the lower layer, is excellent in the dot image reproducibility but is inferior in the development latitude and the scratch resistance. The printing plate precursor of Comparative Example 2, wherein the upper heat-sensitive layer contains a single surface active agent, which is the surface active agent for improving the developing property, is excellent in the development latitude and the scratch resistance but is inferior in the dot image reproducibility.

On the other hand, the lithographic printing plate precursors of the invention in Examples 1 to 3 are excellent not only in the development latitude and the scratch resistance and also good in the dot image reproducibility.

<Synthesis of Fluorine-containing Polymer 1>

In a glass flask equipped with a stirrer, a condenser and a thermometer were charged 30 parts by weight of Florine-containing monomer (A-31), 20 parts by weight of methyl methacrylate, 10 parts by weight of hydroxyethyl methacrylate, 15 parts by weight of isobutyl methacrylate and 150 parts of methyl isobutyl ketone. To the mixture were added 0.4 parts by weight of azobisisobutyronitrile as a polymerization initiator and 0.3 parts by weight of laurylmercaptan as a chain-transfer agent under refluxing while introducing a nitrogen gas, followed by refluxing for 7 hours to complete the polymerization, whereby Flourine-containing polymer 1 was synthesized. The molecular weight (Mn) thereof measured by gel permeation chromatography (GPC) and calculated in terms of polystyrene was 10,000.

>Syntheses of Fluorine-containing Polymers 2 to 5>

In the same manner as in synthesis of fluorine-containing polymer 1 except for using the monomers and copolymerization ratios as shown in Table A, Fluorine-containing polymers 2 to 5 were synthesized.

TABLE A

| F-Cont. Poly-mer | F-Cont. Mono-mer | Copolymerization Ratio (parts by weight) | | | | | |
|---|---|---|---|---|---|---|---|
| | | F-Cont. Monomer | MMA | HEMA | IBMA | LMA | OMA |
| 1 | A-31 | 30 | 20 | 10 | 15 | — | — |
| 2 | A-31 | 40 | — | 15 | 10 | — | 15 |
| 3 | A-15 | 30 | 20 | 10 | — | 10 | — |
| 4 | A-17 | 30 | 15 | 15 | — | — | 10 |
| 5 | A-23 | 40 | — | 15 | — | 10 | 10 |

Note:
F-cont.: Fluorine-containing
MMA: Methyl methacrylate
HEMA: Hydroxyethyl methacrylate
IBMA: Isobutyl methacrylate
LMA: Lauryl methacrylate
DMA: Octahydro-4,7-methane-1H-inden-5-ylmethacrylate <Preparation of Support>

A 0.3 mm-thick aluminum plate (JIS 1050) was degreased by washing with trichloroethylene and the surface thereof was grained using a nylon brush and an aqueous suspension of 400-mesh pumice stone and then thoroughly washed with water. The plate was etched by immersing in an aqueous 25% sodium hydroxide solution at 45° C. for 9 seconds, washed with water, immersed in 20% nitric acid for 20 seconds and then washed with water. The etched amount of the grained surface was about 3 g/m$^2$. Thereafter, the plate was anodized in 7% sulfuric acid as an electrolyte at a current density of 15 A/dm$^2$ to provide a direct current anodized film in an amount of 3 g/m$^2$. The plate was washed with water, dried and further treated with an aqueous 2.5% by weight sodium silicate solution at 30° C. for 10 seconds. An undercoat solution described below was coated on the plate and the coated film was dried at 80° C. for 15 seconds to prepare a support. The coverage of the coated film after drying was 15 mg/m$^2$.

(Undercoat solution)

| | |
|---|---|
| High molecular compound shown below | 0.3 g |
| Methanol | 100 g |
| Water | 1 g |

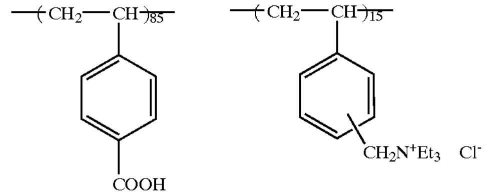

Molecular weight: 28,000

EXAMPLES 101 TO 105 AND COMPARATIVE EXAMPLE 101

<Formation of Recording Layer>

The coating solution for lower layer having the composition shown below was coated on the support described above such that the coverage became 0.75/m$^2$ and dried at 140° C. for 50 seconds using PERFECT OVEN PH200, manufactured by TABAI Corp. by setting Wind Control 7. Thereafter, the coating solution for the upper heat-sensitive layer having the composition shown below was coated such that the coverage became 0.75 g/m$^2$ and dried at 120° C. for one minute to obtain a lithographic printing plate precursor.

| (Coating solution for lower layer) | |
|---|---|
| N-(4-Aminosulfonylphenyl)methacryl-amide/acrylonitrile/methyl methacrylate (monomer ratio = 36/34/30; weight average molecular weight: 50,000) | 1.896 g |
| m,p-Cresol novolac (m/p ratio = 6/4; weight average molecular weight: 4,500; containing 0.8 wt. % of residual monomer) | 0.237 g |
| Cyanine dye A (having the structure shown below) | 0.109 g |
| 4,4'-Bishydroxyphenylsulfone | 0.063 g |
| Tetrahydrophthalic anhydride | 0.190 g |
| p-Toluenesulfonic acid | 0.008 g |
| 3-Methoxy-4-diazodiphenylamine hexafluorophosphate | 0.030 g |
| Compound obtained by replacing counter ion of Ethyl Violet with 6-hydroxynaphthalenesulfonate | 0.05 g |
| Fluorine-containing surfactant (Megafac F176, manufactured by DAINIPPON INK & CHEMICALS, INC.) | 0.035 g |
| Methyl ethyl ketone | 26.6 g |
| 1-Methoxy-2-propanol | 13.6 g |
| γ-Butyrolactone | 13.8 g |

Cyanine Dye A

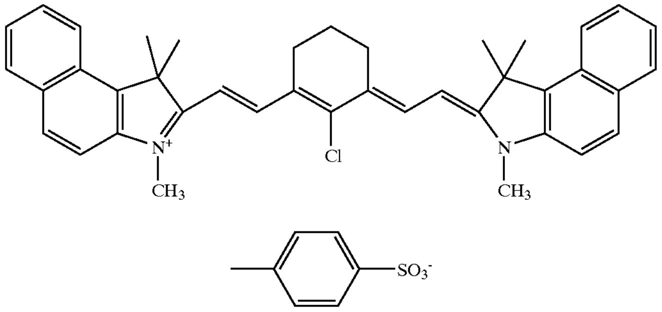

| (Coating solution for upper heat-sensitive layer) | |
|---|---|
| m,p-Cresol novolac (m/p ratio = 6/4; weight average molecular weight: 4,500; containing 0.8 wt. % of unreacted cresol) | 0.237 g |
| Cyanine dye A (having the structure described above) | 0.047 g |
| Dodecyl stearate | 0.060 g |
| Fluorine-containing surfactant (Megafac F176, manufactured by DAINIPPON INK & CHEMICALS, INC. | 0.110 g |
| Fluorine-containing polymer (as shown in Table 2 below) | 0.040 g |
| Methyl ethyl ketone | 10.0 g |

EXAMPLES 106 TO 110 AND COMPARATIVE EXAMPLE 102

The coating solution for the lower layer having the composition shown below were coated on the support described in Example 101 such that the coverage became 0.90 $g/m^2$ and dried at 140° C. for 50 seconds. Then, the coating solution for upper heat-sensitive layer having the composition shown below was coated such that the coverage became 0.1 $g/m^2$ and dried at 120° C. for one minute to obtaine a lithographic printing plate precursor.

| (Coating solution for lower layer) | |
|---|---|
| N-(4-Aminosulfonylphenyl)methacryl-amide/acrylonitrile/methyl methacrylate (monomer ratio = 35/35/30; weight average molecular weight: 50,000) | 1.896 g |
| m,p-Cresol novolac (m/p ratio = 6/4; weight average molecular weight 4,500; containing 0.8 wt. % of residual monomer) | 0.237 g |
| Cyanine dye A (having the structure Described above) | 0.109 g |
| 4,4'-Bishydroxyphenylsulfone | 0.063 g |
| Bis(2-hydroxy-5-methoxyphenyl)-pentafluorophenylmethane | 0.142 g |
| Tetrahydrophthalic anhydride | 0.190 g |
| p-Toluenesulfonic acid | 0.008 g |

-continued

-continued

| | |
|---|---|
| Compound obtained by replacing counter ion of Ethyl Violet with 6-hydroxynaphthalenesulfonate | 0.05 g |
| Fluorine-containing surfactant (Megafac F176, manufactured by DAINIPPON INK & CHEMICALS, INC.) | 0.035 g |
| Methyl ethyl ketone | 26.6 g |
| 1-Methoxy-2-propanol | 13.6 g |
| γ-Butyrolactone | 13.8 g |
| (Coating solution for upper heat-sensitive layer) | |
| m,p-Cresol novolac (m/p ratio = 6/4; weight average molecular weight: 4,500; containing 0.8 wt. % of unreacted cresol) | 0.165 g |
| Cyanine dye A (having the structure described above) | 0.047 g |
| Dodecyl stearate | 0.060 g |
| l-Ethyl-2-(4-methylthiophenyl)-2-oxoethyl-dimethyl-phenylmethyl ammonium bromide | 0.069 g |
| Fluorine-containing surfactant (Megafac F176, manufactured by DAINIPPON INK & CHEMICALS, INC. | 0.110 g |
| Fluorine-containing polymer (as shown in TABLE 2 below) | 0.060 g |
| Methyl ethyl ketone | 15.1 g |
| 1-Methoxy-2-propanol | 7.7 g |

<Evaluation of Development Latitude>

Using Trendsetter manufactured by Creo Inc., a test pattern was imagewise drawn on each of the lithographic printing plate precursors obtained at a beam intensity of 9 W and a drum rotation speed of 150 rpm.

Each of the lithographic printing plate precursors exposed under the conditions described above was developed using PS Processor 900H, manufactured by Fuji Photo film Co., Ltd., charged with a developer DT-1, manufactured by Fuji Photo film Co., Ltd., wherein the diluting ratio was changed, at a developer temperature of 30° C. for a developing time of 12 seconds. The presence of stain or coloration caused by the residual film of the recording layer due to development inferior was confirmed, and the electric conductivity of the developer in which development could be well performed was measured. The results are shown in Table 2. The case wherein the difference between the maximum value and the minimum value is large is evaluated to be excellent in the development latitude.

TABLE 2

| | Fluorine-Containing Polymer | Development Latitude (ms/cm) Minimum Value | Maximum Value |
|---|---|---|---|
| Example 101 | 1 | 39 | 58 |
| Example 102 | 2 | 39 | 59 |
| Example 103 | 3 | 39 | 57 |
| Example 104 | 4 | 39 | 57 |
| Example 105 | 5 | 39 | 57 |
| Comparative Example 101 | None | 39 | 49 |
| Example 106 | 1 | 37 | 55 |
| Example 107 | 2 | 37 | 55 |
| Example 108 | 3 | 37 | 55 |
| Example 109 | 4 | 37 | 53 |
| Example 110 | 5 | 37 | 55 |
| Comparative Example 102 | None | 37 | 47 |

As is clear from Table 2, the lithographic printing plate precursors of the invention exhibit the good exposure latitude as compared with the lithographic printing plate precursors for comparison.

As described above, according to the lithographic printing plate precursor of the invention and the method of plate making of the invention, by using the heat-sensitive layer composed of a double layer structure, and by incorporating at least two kinds of surface active agents in the upper heat-sensitive layer or incorporating different surface active agents in each of the lower layer and the upper heat-sensitive layer, the sensitivity and the development latitude at the image formation are excellent, the generation of defects caused by scratches in the image area is restrained, and good images can be formed.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that-various changes and modifications can be made therein without departing from the spirit and score thereof.

What is claimed is:

1. A positive working lithographic printing plate precursor comprising a lower layer containing a water-insoluble and alkali-soluble resin, and an upper heat-sensitive layer containing a water-insoluble and alkali-soluble resin and an infrared absorbing dye and increasing the solubility in an alkaline aqueous solution by heating, provided in this order on a hydrophilic support, and (a) the upper heat-sensitive layer containing at least two kinds of fluorine-containing surface active agents, or (b) the lower layer and upper heat-sensitive layer each containing a surface active agent different from each other.

2. The positive working lithographic printing plate precursor as claimed in claim 1, wherein the upper heat-sensitive layer contains at least two kinds of fluorine-containing surface active agents.

3. The positive working lithographic printing plate precursor as claimed in claim 1, wherein the lower layer and upper heat-sensitive layer each contain a surface active agent different from each other.

4. The positive working lithographic printing plate precursor as claimed in claim 3, wherein a concentration of the surface active agent contained in the upper heat-sensitive layer is higher than a concentration of the surface active agent contained in the lower layer.

5. The positive working lithographic printing plate precursor as claimed in claim 3, wherein at least one of the surface active agents is a fluorine-containing surface active agent.

6. The positive working lithographic printing plate precursor as claimed in claim 1, wherein the water-insoluble and alkali-soluble resin contained in the upper heat-sensitive layer is a resin having a phenolic hydroxyl group.

* * * * *